(12) United States Patent
Sutardja et al.

(10) Patent No.: US 7,312,739 B1
(45) Date of Patent: *Dec. 25, 2007

(54) COMMUNICATION DRIVER

(75) Inventors: Sehat Sutardja, Los Altos Hills, CA (US); Pierte Roo, Mountain View, CA (US)

(73) Assignee: Marvell International Ltd., Hamilton (BM)

(*) Notice: Subject to any disclaimer, the term of this patent is extended or adjusted under 35 U.S.C. 154(b) by 0 days.

This patent is subject to a terminal disclaimer.

(21) Appl. No.: 11/432,886

(22) Filed: May 12, 2006

Related U.S. Application Data

(63) Continuation of application No. 11/178,350, filed on Jul. 12, 2005, now Pat. No. 7,113,121, which is a continuation of application No. 11/106,497, filed on Apr. 15, 2005, now Pat. No. 7,095,348, which is a continuation of application No. 10/972,143, filed on Oct. 25, 2004, which is a continuation of application No. 10/191,924, filed on Jul. 8, 2002, now Pat. No. 6,844,837, which is a continuation-in-part of application No. 09/920,241, filed on Aug. 1, 2001, and a continuation-in-part of application No. 09/737,474, filed on Dec. 18, 2000, now Pat. No. 6,462,688, said application No. 10/972,143 is a continuation-in-part of application No. 09/737,743, filed on Dec. 18, 2000, now Pat. No. 7,194,037, and a continuation-in-part of application No. 09/629,092, filed on Jul. 31, 2000, now Pat. No. 6,775,529.

(60) Provisional application No. 60/211,571, filed on Jun. 15, 2000, provisional application No. 60/206,409, filed on May 23, 2000.

(51) Int. Cl.
*H03M 1/66* (2006.01)

(52) U.S. Cl. ............... 341/144; 375/256; 375/296; 341/143; 341/153

(58) Field of Classification Search ............... 341/143, 341/144, 153; 375/256, 259, 296, 297
See application file for complete search history.

(56) References Cited

U.S. PATENT DOCUMENTS 3,297,951 A 1/1967 Blasbalg (Continued)

FOREIGN PATENT DOCUMENTS

DE 10 2004 017 497 11/2004

(Continued)

OTHER PUBLICATIONS

U.S. Appl. No. 09/737,743, filed Dec. 2000, Sutardja.

(Continued)

*Primary Examiner*—Howard L. Williams

(57) ABSTRACT

An Ethernet controller includes a decoder, and T sets of transmit circuits. Each set of transmit circuits receives one of T decoded signals from the decoder, and includes a digital-to-analog converter (DAC) that provides a transmit output signal, and a replica circuit that provides a replica output signal. Each DAC includes N current sources arranged in parallel and differentially, and M delay elements. Each current source includes a control input. A sum of outputs of the N current sources forms each transmit output signal. An input of the first delay element and the control input of the first current source receive a decoded signal. An input of an mth delay element is in communication with an output of an m−1th delay element. The output of each delay element controls a corresponding control input of a current source. A sum of the transmit output signals forms an accumulated output signal.

12 Claims, 22 Drawing Sheets

U.S. PATENT DOCUMENTS

| | | |
|---|---|---|
| 3,500,215 A | 3/1970 | Leuthold et al. |
| 3,521,170 A | 7/1970 | Leuthold et al. |
| 3,543,009 A | 11/1970 | Voelcher, Jr. |
| 3,793,589 A | 2/1974 | Puckette |
| 3,973,089 A | 8/1976 | Puckett |
| 4,071,842 A | 1/1978 | Tewksbury |
| 4,112,253 A | 9/1978 | Wilhelm |
| 4,131,767 A | 12/1978 | Weinstein |
| 4,152,541 A | 5/1979 | Yuen |
| RE30,111 E | 10/1979 | Blood, Jr. |
| 4,309,673 A | 1/1982 | Norberg et al. |
| 4,321,753 A | 3/1982 | Fusari |
| 4,362,909 A | 12/1982 | Snijders et al. |
| 4,393,370 A | 7/1983 | Hareyama |
| 4,393,494 A | 7/1983 | Belforte et al. |
| 4,408,190 A | 10/1983 | Nagano |
| 4,464,545 A | 8/1984 | Werner |
| 4,503,421 A | 3/1985 | Hareyama et al. |
| 4,527,126 A | 7/1985 | Petrich et al. |
| 4,535,206 A | 8/1985 | Falconer |
| 4,591,832 A | 5/1986 | Fling et al. |
| 4,605,826 A | 8/1986 | Kanemasa |
| 4,621,172 A | 11/1986 | Kanemasa et al. |
| 4,621,356 A | 11/1986 | Scipione |
| 4,626,803 A | 12/1986 | Holm |
| 4,715,064 A | 12/1987 | Claessen |
| 4,727,566 A | 2/1988 | Dahlqvist |
| 4,746,903 A | 5/1988 | Czarniak et al. |
| 4,816,830 A | 3/1989 | Cooper |
| 4,817,081 A | 3/1989 | Wouda et al. |
| 4,868,571 A | 9/1989 | Inamasu |
| 4,878,244 A | 10/1989 | Gawargy |
| 4,888,762 A | 12/1989 | Arai |
| 4,894,820 A | 1/1990 | Miyamoto |
| 4,935,919 A | 6/1990 | Hiraguchi |
| 4,947,171 A | 8/1990 | Pfiefer et al. |
| 4,970,715 A | 11/1990 | McMahan |
| 4,972,360 A | 11/1990 | Cukier et al. |
| 4,988,960 A | 1/1991 | Tomisawa |
| 4,993,045 A | 2/1991 | Alfonso |
| 4,999,830 A | 3/1991 | Agazzi |
| 5,018,134 A | 5/1991 | Kokubo et al. |
| 5,043,730 A | 8/1991 | Obinnata |
| 5,084,865 A | 1/1992 | Koike |
| 5,119,365 A | 6/1992 | Warner et al. |
| 5,136,260 A | 8/1992 | Yousefi-Elezei |
| 5,148,427 A | 9/1992 | Buttle et al. |
| 5,153,450 A | 10/1992 | Ruetz |
| 5,164,725 A | 11/1992 | Long |
| 5,175,764 A | 12/1992 | Patel et al. |
| 5,185,538 A | 2/1993 | Kondoh et al. |
| 5,202,528 A | 4/1993 | Iwaooji |
| 5,204,880 A | 4/1993 | Wurster et al. |
| 5,212,659 A | 5/1993 | Scott et al. |
| 5,222,084 A | 6/1993 | Takahashi |
| 5,243,346 A | 9/1993 | Inami |
| 5,243,347 A | 9/1993 | Jackson et al. |
| 5,245,231 A | 9/1993 | Kocis et al. |
| 5,245,654 A | 9/1993 | Wilkison et al. |
| 5,248,956 A | 9/1993 | Himes |
| 5,253,249 A | 10/1993 | Fitzgerald et al. |
| 5,253,272 A | 10/1993 | Jaeger et al. |
| 5,254,994 A | 10/1993 | Takakura et al. |
| 5,267,269 A | 11/1993 | Shih et al. |
| 5,269,313 A | 12/1993 | DiPinto |
| 5,272,453 A | 12/1993 | Traynor et al. |
| 5,280,526 A | 1/1994 | Latureli |
| 5,282,157 A | 1/1994 | Murphy et al. |
| 5,283,582 A | 2/1994 | Krenik |
| 5,305,379 A | 4/1994 | Takeuchi et al. |
| 5,307,064 A | 4/1994 | Kudoh |
| 5,307,405 A | 4/1994 | Sih |
| 5,323,157 A | 6/1994 | Ledzius et al. |
| 5,325,400 A | 6/1994 | Co et al. |
| 5,357,145 A | 10/1994 | Segaram |
| 5,365,935 A | 11/1994 | Righter et al. |
| 5,367,540 A | 11/1994 | Kakushi et al. |
| 5,375,147 A | 12/1994 | Awata et al. |
| 5,388,092 A | 2/1995 | Koyama et al. |
| 5,388,123 A | 2/1995 | Uesugi et al. |
| 5,392,042 A | 2/1995 | Pelton |
| 5,399,996 A | 3/1995 | Yates et al. |
| 5,403,421 A | 4/1995 | Hinterseer |
| 5,418,478 A | 5/1995 | Van Brunt et al. |
| 5,440,514 A | 8/1995 | Flannagan et al. |
| 5,440,515 A | 8/1995 | Chang et al. |
| 5,444,739 A | 8/1995 | Uesegi et al. |
| 5,465,272 A | 11/1995 | Smith |
| 5,471,665 A | 11/1995 | Pace et al. |
| 5,479,124 A | 12/1995 | Pun et al. |
| 5,489,873 A | 2/1996 | Kamata et al. |
| 5,507,036 A | 4/1996 | Vagher |
| 5,508,656 A | 4/1996 | Jaffard et al. |
| 5,517,141 A | 5/1996 | Abdi et al. |
| 5,517,435 A | 5/1996 | Sugiyama |
| 5,521,540 A | 5/1996 | Marbot |
| 5,537,113 A | 7/1996 | Kawabata |
| 5,539,403 A | 7/1996 | Tani et al. |
| 5,539,405 A | 7/1996 | Norsworthy |
| 5,539,773 A | 7/1996 | Knee et al. |
| 5,557,027 A | 9/1996 | Kemp |
| 5,559,476 A | 9/1996 | Zhang et al. |
| 5,568,064 A | 10/1996 | Beers et al. |
| 5,568,142 A | 10/1996 | Velazquex et al. |
| 5,572,158 A | 11/1996 | Lee et al. |
| 5,572,159 A | 11/1996 | McFarland |
| 5,577,027 A | 11/1996 | Cheng |
| 5,579,004 A | 11/1996 | Linz |
| 5,585,795 A | 12/1996 | Yuasa et al. |
| 5,585,802 A | 12/1996 | Cabler et al. |
| 5,587,681 A | 12/1996 | Fobbester |
| 5,589,788 A | 12/1996 | Goto |
| 5,596,439 A | 1/1997 | Dankberg et al. |
| 5,600,321 A | 2/1997 | Winen |
| 5,613,233 A | 3/1997 | Vagher |
| 5,625,357 A | 4/1997 | Cabler |
| 5,629,652 A | 5/1997 | Weiss |
| 5,648,738 A | 7/1997 | Welland et al. |
| 5,651,029 A | 7/1997 | Yang |
| 5,659,609 A | 8/1997 | Koizumi et al. |
| 5,663,728 A | 9/1997 | Essenwanger |
| 5,666,354 A | 9/1997 | Cecchi et al. |
| 5,684,482 A | 11/1997 | Galton |
| 5,687,330 A | 11/1997 | Gist et al. |
| 5,696,796 A | 12/1997 | Poklemba |
| 5,703,541 A | 12/1997 | Nakashima |
| 5,719,515 A | 2/1998 | Danger |
| 5,726,583 A | 3/1998 | Kaplinsky |
| 5,745,564 A | 4/1998 | Meek |
| 5,757,219 A | 5/1998 | Weedon et al. |
| 5,757,298 A | 5/1998 | Manley et al. |
| 5,760,726 A | 6/1998 | Koifman et al. |
| 5,790,060 A | 8/1998 | Tesche |
| 5,790,658 A | 8/1998 | Yip et al. |
| 5,796,725 A | 8/1998 | Muraoka |
| 5,798,661 A | 8/1998 | Runaldue et al. |
| 5,798,664 A | 8/1998 | Nagahori et al. |
| 5,812,597 A | 9/1998 | Graham et al. |
| 5,821,892 A | 10/1998 | Smith |
| 5,822,426 A | 10/1998 | Rasmus et al. |
| 5,825,819 A | 10/1998 | Cogburn |
| 5,834,860 A | 11/1998 | Parsons et al. |
| 5,838,177 A | 11/1998 | Keeth |
| 5,838,186 A | 11/1998 | Inoue et al. |

| | | | | | | |
|---|---|---|---|---|---|---|
| 5,841,386 | A | 11/1998 | Leduc | 6,313,775 | B1 | 11/2001 | Lindfors et al. |
| 5,841,809 | A | 11/1998 | Koizumi et al. | 6,332,004 | B1 | 12/2001 | Chan |
| 5,844,439 | A | 12/1998 | Zortea | 6,333,959 | B1 | 12/2001 | Lai et al. |
| 5,859,552 | A | 1/1999 | Do et al. | 6,339,390 | B1 | 1/2002 | Velazquez et al. |
| 5,864,587 | A | 1/1999 | Hunt | 6,340,940 | B1 | 1/2002 | Melanson |
| 5,880,615 | A | 3/1999 | Bazes | 6,346,899 | B1 | 2/2002 | Hadidi |
| 5,887,059 | A | 3/1999 | Xie et al. | 6,351,229 | B1 | 2/2002 | Wang |
| 5,894,496 | A | 4/1999 | Jones | RE37,619 | E | 4/2002 | Mercer et al. |
| 5,898,340 | A | 4/1999 | Chatterjee et al. | 6,369,734 | B2 | 4/2002 | Volk |
| 5,930,686 | A | 7/1999 | Devline et al. | 6,370,190 | B1 | 4/2002 | Young et al. |
| 5,936,450 | A | 8/1999 | Unger | 6,373,417 | B1 | 4/2002 | Melanson |
| 5,940,442 | A | 8/1999 | Wong et al. | 6,373,908 | B2 | 4/2002 | Chan |
| 5,940,498 | A | 8/1999 | Bardl | 6,377,640 | B2 | 4/2002 | Trans |
| 5,949,362 | A | 9/1999 | Tesch et al. | 6,377,683 | B1 | 4/2002 | Dobson et al. |
| 5,963,069 | A | 10/1999 | Jefferson et al. | 6,385,238 | B1 | 5/2002 | Nguyen et al. |
| 5,982,317 | A | 11/1999 | Steensgaard-Madison | 6,385,442 | B1 | 5/2002 | Vu et al. |
| 5,999,044 | A | 12/1999 | Wohlfarth et al. | 6,389,077 | B1 | 5/2002 | Chan |
| 6,005,370 | A | 12/1999 | Gustavson | 6,408,032 | B1 | 6/2002 | Lye et al. |
| 6,014,048 | A | 1/2000 | Talaga et al. | 6,411,647 | B1 | 6/2002 | Chan |
| 6,037,812 | A | 3/2000 | Gaudet | 6,415,003 | B1 | 7/2002 | Raghaven |
| 6,038,266 | A | 3/2000 | Lee et al. | 6,421,377 | B1 | 7/2002 | Langberg et al. |
| 6,043,766 | A | 3/2000 | Hee et al. | 6,421,534 | B1 | 7/2002 | Cook et al. |
| 6,044,489 | A | 3/2000 | Hee et al. | 6,433,608 | B1 | 8/2002 | Huang |
| 6,046,607 | A | 4/2000 | Kohdaka | 6,441,761 | B1 | 8/2002 | Viswanathan |
| 6,047,346 | A | 4/2000 | Lau et al. | 6,452,428 | B1 | 9/2002 | Mooney et al. |
| 6,049,706 | A | 4/2000 | Cook et al. | 6,462,688 | B1 | 10/2002 | Sutardja |
| 6,052,076 | A | 4/2000 | Patton, III et al. | 6,468,032 | B2 | 10/2002 | Patel |
| 6,057,716 | A | 5/2000 | Dinteman et al. | 6,476,476 | B1 | 11/2002 | Glenn |
| 6,067,327 | A | 5/2000 | Creigh et al. | 6,476,746 | B2 | 11/2002 | Viswanathan |
| 6,087,968 | A | 7/2000 | Roza | 6,476,749 | B1 | 11/2002 | Yeap et al. |
| 6,094,082 | A | 7/2000 | Gaudet | 6,477,200 | B1 | 11/2002 | Agazzi et al. |
| 6,100,830 | A | 8/2000 | Dedic | 6,492,922 | B1 | 12/2002 | New |
| 6,121,831 | A | 9/2000 | Mack | 6,501,402 | B2 | 12/2002 | Boxho |
| 6,137,328 | A | 10/2000 | Sung | 6,509,854 | B1 | 1/2003 | Morita et al. |
| 6,140,857 | A | 10/2000 | Bazes | 6,509,857 | B1 | 1/2003 | Nakao |
| 6,148,025 | A | 11/2000 | Shirani et al. | 6,531,973 | B2 | 3/2003 | Brooks et al. |
| 6,150,856 | A | 11/2000 | Morzano | 6,535,987 | B1 | 3/2003 | Ferrant |
| 6,154,784 | A | 11/2000 | Liu | 6,539,072 | B1 | 3/2003 | Donnelly et al. |
| 6,163,283 | A | 12/2000 | Schofield | 6,556,677 | B1 | 4/2003 | Hardy |
| 6,163,289 | A | 12/2000 | Ginetti | 6,563,870 | B1 | 5/2003 | Schenk |
| 6,163,579 | A | 12/2000 | Harrington et al. | 6,570,931 | B1 | 5/2003 | Song |
| 6,166,572 | A | 12/2000 | Yamaoka | 6,576,746 | B2 | 6/2003 | McBride et al. |
| 6,172,634 | B1 | 1/2001 | Leonowich et al. | 6,577,114 | B1 | 6/2003 | Roo |
| 6,173,019 | B1 | 1/2001 | Hee et al. | 6,583,742 | B1 | 6/2003 | Hossack |
| 6,177,896 | B1 | 1/2001 | Min | 6,594,304 | B2 | 7/2003 | Chan |
| 6,185,263 | B1 | 2/2001 | Chan | 6,608,743 | B1 | 8/2003 | Suzuki |
| 6,188,282 | B1 | 2/2001 | Montalvo | 6,633,178 | B2 | 10/2003 | Wilcox et al. |
| 6,191,719 | B1 | 2/2001 | Bult et al. | 6,687,286 | B1 | 2/2004 | Leonowich et al. |
| 6,192,226 | B1 | 2/2001 | Fang | 6,690,742 | B2 | 2/2004 | Chan |
| 6,201,490 | B1 | 3/2001 | Kawano et al. | 6,714,825 | B1 | 3/2004 | Tanaka |
| 6,201,831 | B1 | 3/2001 | Agazzi et al. | 6,721,379 | B1 | 4/2004 | Cranford, Jr. et al. |
| 6,201,841 | B1 | 3/2001 | Iwamatsu et al. | 6,731,748 | B1 | 5/2004 | Edgar, III et al. |
| 6,204,788 | B1 | 3/2001 | Tani | 6,744,831 | B2 | 6/2004 | Chan |
| 6,211,716 | B1 | 4/2001 | Nguyen et al. | 6,744,931 | B2 | 6/2004 | Kormiya et al. |
| 6,215,429 | B1 | 4/2001 | Fischer et al. | 6,751,202 | B1 | 6/2004 | Henrie |
| 6,223,061 | B1 | 4/2001 | Dacus et al. | 6,765,931 | B1 | 7/2004 | Rabenko et al. |
| 6,236,345 | B1 | 5/2001 | Dagnachew et al. | 6,775,529 | B1 | 8/2004 | Roo |
| 6,236,346 | B1 | 5/2001 | Schofield | 6,816,097 | B2 | 11/2004 | Brooks et al. |
| 6,236,645 | B1 | 5/2001 | Agazzi | 6,823,028 | B1 | 11/2004 | Phanse |
| 6,249,164 | B1 | 6/2001 | Cranford, Jr. et al. | 6,844,837 | B1 | 1/2005 | Sutardja |
| 6,249,249 | B1 | 6/2001 | Obayashi et al. | 6,864,726 | B2 | 3/2005 | Levin et al. |
| 6,259,680 | B1 | 7/2001 | Blackwell et al. | 6,882,216 | B2 | 4/2005 | Kang |
| 6,259,745 | B1 | 7/2001 | Chan | 6,980,644 | B1 | 12/2005 | Sallaway et al. |
| 6,259,957 | B1 | 7/2001 | Alexander et al. | 2001/0050585 | A1 | 12/2001 | Carr |
| 6,266,367 | B1 | 7/2001 | Strait | 2002/0009057 | A1 | 1/2002 | Blackwell et al. |
| 6,271,782 | B1 | 8/2001 | Steensgaard-Madsen | 2002/0061087 | A1 | 5/2002 | Williams |
| 6,275,098 | B1 | 8/2001 | Uehara et al. | 2002/0084857 | A1 | 7/2002 | Kim |
| 6,288,604 | B1 | 9/2001 | Shih et al. | 2002/0136321 | A1 | 9/2002 | Chan |
| 6,289,068 | B1 | 9/2001 | Hassoun et al. | 2002/0181601 | A1 | 12/2002 | Huang et al. |
| 6,295,012 | B1 | 9/2001 | Greig | 2003/0002570 | A1 | 1/2003 | Chan |
| 6,298,046 | B1 | 10/2001 | Thiele | 2003/0174660 | A1 | 9/2003 | Blon et al. |
| 6,307,490 | B1 | 10/2001 | Litfin et al. | 2004/0005015 | A1 | 1/2004 | Chan |
| 6,309,077 | B1 | 10/2001 | Saif et al. | 2004/0090981 | A1 | 5/2004 | Lin et al. |

| | | | |
|---|---|---|---|
| 2004/0091071 A1 | 5/2004 | Lin et al. | |
| 2004/0105504 A1 | 6/2004 | Chan | |
| 2004/0141569 A1 | 7/2004 | Agazzi | |
| 2004/0208312 A1 | 10/2004 | Okuda | |
| 2005/0025266 A1 | 2/2005 | Chan | |

FOREIGN PATENT DOCUMENTS

| | | |
|---|---|---|
| EP | 0800 278 | 8/1997 |
| JP | 57-48827 | 3/1982 |
| JP | 58-111415 | 7/1983 |
| JP | 62-159925 | 7/1987 |
| JP | 63-300700 | 7/1988 |
| JP | 204527 | 8/1989 |
| JP | 3-273704 | 12/1991 |
| JP | 4-293306 | 10/1992 |
| JP | 4-351109 | 12/1992 |
| JP | 05-064231 | 3/1993 |
| JP | 06-029853 | 2/1994 |
| JP | 06-98731 | 4/1994 |
| JP | 6-276182 | 9/1994 |
| JP | 7-131260 | 5/1995 |
| JP | 09-55770 | 8/1995 |
| JP | 09-270707 | 3/1996 |
| JP | 10-126183 | 5/1998 |
| JP | 2001-177409 | 12/1999 |
| JP | 06-97831 | 4/2005 |
| JP | 09-270707 | 4/2005 |
| JP | 2001-177409 | 4/2005 |
| TW | 0497334 | 8/2002 |
| TW | 0512608 | 12/2002 |
| TW | 0545016 | 8/2003 |
| WO | WO 99/46867 | 9/1999 |
| WO | WO 00/27079 | 5/2000 |
| WO | WO 00/28663 | 5/2000 |
| WO | WO 00/28663 A2 | 5/2000 |
| WO | WO 00/28663 A3 | 5/2000 |
| WO | WO 00/28668 | 5/2000 |
| WO | WO 00/28691 | 5/2000 |
| WO | WO 00/28691 A2 | 5/2000 |
| WO | WO 00/28691 A3 | 5/2000 |
| WO | WO 00/28712 | 5/2000 |
| WO | WO 00/35094 | 6/2000 |

OTHER PUBLICATIONS

U.S. Appl. No. 09/920,240, filed Aug. 2001, Roo, Pierte.
U.S. Appl. No. 09/920,241, filed Aug. 2001, Roo, Pierte.
U.S. Appl. No. 60/106,265, filed Oct. 1998, Chan.
U.S. Appl. No. 60/107,105, filed Nov. 1998, Chan.
U.S. Appl. No. 60/107,702, filed Nov. 1998, Chan.
U.S. Appl. No. 60/108,001, filed Nov. 1998, Chan.
Abidi et al; "FA 7.2: The Future of CMOS Wireless Transceivers"; Feb. 7, 1997, pp. 118-119, 440.
Abidi, "TP 11.1: Direct-Conversion Radio Transceivers for Digital Communications" 1995.
American National Standard, "Fibre Distributed Data interface (FDDI)-Token Ring Twisted Pair Layer Medium Dependent (TP-PMD)", Sep. 25, 1995.
Azadet et al; "A Gigabit Transceiver Chip Set for UTP CA-6 Cables in Digital CMOS Technology"; Feb. 2000, IEEE Int. Solid State Circuits Conference.
Azadet, Kamran Nicole, Chris; "Low-Power Equalizer Architectures for High-Speed Modems"; Oct. 1998; pp. 118-126.
Baird et al; "A Mixed Signal 120M s PRML Solution for DVD Systems", 1999.
Baker, "An Adaptive Cable Equalizer for Serial Digital Rates to 400Mb/s", Feb. 1996
Banu et al; "A BiCMOS Double-Low-IF Receiver for GSM", 1997, pp. 521-524.
Bertolaccini, Mario et al; "A Precision Baseline Offset and Drift Corrector for Low-Frequency Applications", IEEE Transactions on Instrumentation and Measurement, vol. IM-34, No. 3, Sep. 1985, pp. 405-412.

Chan et al; A 100 Mb/s CMOS 100Base-T4 Fast Ethernet Transceiver for Category 3, 4 and 5 UTP, 1998, IEEE Int. Solid State Circuits Conf. 1998.
Chang et al; "A CMOS Channel-Select Filter for a Direct-Conversion Wireless Receiver", 1996, pp. 62-63, IEEE Symposium on VLSI Circuits.
Chang et al; Large Suspended Inductors on Silicon and Their Use in a 1- μm CMOS RF Amplifier, May 1993, pp. 246-248.
Chien et al; "TP 12.4: A 900—MHz Local Oscillator using DLL-based Frequency Multiplier Technique for PCS Applications", IEEE ISSCC Feb. 2000 pp. 202-203, 458.
Chien, "Delay Based Monolithic CMOS Frequency Synthesizer for Portable Wireless Applications", May 20, 1998.
Chien, "Low-Noise Local Oscillator Design Techniques using DLL-based Frequency Multiplier for Wireless Applications", 2000, Spring.
Chien, "Monolithic CMOS Frequency Synthesizer for Cellular Applications", Mar. 12-13; 9 pages, further date info unavailable.
Chin et al; "A 10-b 125 MHz CMOS digital-to-analog (DAC) with threshold—voltage compensated current sources", Nov. 1994, pp. 1374-1380.
Cho et al; "A Single-Chip CMOS Direct Conversion Transceiver for 900 MHz Spread-Spectrum Digital Cordless Telephones"; 1999, 10 pages.
Craninckx et al: "A 1.8-GHz Low-Phase-Noise CMOS VCO Using Optimized Hollow Spiral Inductors"; 1997, pp. 736-744, IEEE JSSC.
Craninckx et al; "A 1.8-GHz Low-Phase-Noise Voltage-Controlled Oscillator with Prescaler"; 1995, pp. 1474-1482.
Dally et al; "Digital Systems Engineering", cover and pp. 390-391, no date.
Dally et al; "High Performance Electrical Signaling", no date.
Dauphinee et al; "SP 23.7: A Balanced 1.5 GHz Voltage Controlled Oscillator with an Integrated LC Resonator", 1997, pp. 390-391, 491.
Davies; "Digital Generation of Low—Frequency Sine Waves", Jun. 1969, pp. 97-105.
Dec et al; "MP 4.8: A 1.9 GHz Micromachine-Based Low-Phase-Noise CMOS VCO"; 1999, pp. 80-81, 449.
Dehng et al; "A Fast-Lock Mixed-Mode DLL Using a 2-b SAR Algorithm", IEEE Journal of Solid State Circuits vol. 36 No. 10 Oct. 2001 p. 1464-1471.
Dehng et al: "Clock-Deskaw Buffer Using a SAR-Controlled Delay-Locked Loop", IEEE Journal of Solid State Circuits; Aug. 2000, vol. 35 No. 8 p. 1128-1136.
Dolle, "A Dynamic Line-Termiantion Circuit for Multireceiver Nets", Dec. 1993, pp. 1370-1373.
DP83220 CDL "Twisted Pair FDDI Transceiver Device", Oct. 1992.
Dunning, Jim, "An All-Digital Phase-Locked Loop with 50-Cycle Lock Time Suitable for High-Performance Microprocessors", IEEE Journal of Solid-State Circuits, vol. 30, No. 4, Apr. 1995, pp. 412-422.
Efendovich et al; "Multifrequency Zero-Jitter Delay-Locked Loop", Jan. 1994, 67-70.
Eto et al; "A 333 MHz, 20mW, 18ps Resolution Digital DLL using Current-controlled Delay with Parallel Variables Resistor DAC (PVR-DAC)"; Aug. 28-30, 2000, pp. 349-350, IEEE.
Everitt et al; "10/100Mb/s CMOS Ethernet Transceiver for 10BaseT, 10BaseTX and 100BaseFX", Feb. 1998 IEEE ISSCC.
Everitt, James et al; "A CMOS Transceiver for 10-Mb/s and 100-Mb/s Ethernet", IEEE Journal of Solid-State Circuits, vol. 33, No. 12, Dec. 1998, pp. 2169-2177.
Falconer; "Echo Cancellation in Two Wire Full Duplex With Estimation of Far-End Data Components"; Aug. 18, 1985.
Farjad-rad, et al; "4.5 A 0.2-2GHz 12mW Multiplying DLL for Low-Jitter Clock Synthesis in Highly Integrated Data Communication Chip" IEEE ISSCC 2000.
Fournier et al; "A 130-MHz 8-b CMOS video DAC for HDTV applications"; Jul. 1991, pp. 1073-1077, IEEE Journal of Solid State Circuits.
Fuad Surial Atiya et al; "An Operational Amplifier Circulator Based on the Weighted Summer", Jun. 1975.

Gabara; "On-Chip Terminating Registers for High Speed ECL-CMOS Interfaces", 1992, pp. 292-295.
Gardner, "Charge-Pump Phase-Lock Loops", Nov. 1980, pp. 1849-1858.
Garlepp et al; "A Portable Digital DLL Architecture for CMOS Interface Circuits", 1998 Symposium on VLSI Circuits Digest of Technical Papers, pp. 214-215; IEEE.
Gawargy; "Electronic Hybrid Circuit"; Oct. 31, 1989.
Gharpurey et al; Modeling and Analysis of Substrate Coupling in Integrated Circuits, Mar. 1996, pp. 344-353, IEEE JSSC.
Gigabit Ethernet Alliance; "Gigabit Ethernet 1000Base-T Whitepaper", copyright 1977.
Goldberg, "Gigabit Ethernet PHY Chip Sets LAN Speed Record for Copper Story" 6 pages, no date.
Goldberg, Lee; "Gigabit Ethernet PHY Chip Sets LAN Speed Record for CopperStory", Tech Insights, Nov. 16, 1998.
Gotoh et al; "All-Digital Multi-Phase Delay Locked Loop for Internal Timing Generation in Embedded and/or High-Speed DRAMS", IEEE Symposium on VLSI Circuits, 1997.
Gray et al, "Analysis and Design of Analog Integrated Circuits", Fourth Edition, pp. 217-221, no date.
Gray et al; "Analysis and Design of Analog Integrated Circuits", 1997.
Gray et al; "Analysis and Design of Analog Integrated Circuits", pp. 270 and 274, no date.
Gray et al; "Future Directions in Silicon ICs for RF Personal Communications", 1995, pp. 83-90.
H4000 Digital Ethernet Transceiver Technical Manual, Distributed Systems, Chapter 3, pp. 3-1 to 3-11, copyright 1982 by Digital Equipment Corporation.
Hajimiri et al; "Phase Noise in Multi-Gigahertz CMOS Ring Oscillators", 1998, 49-52, IEEE Custom Integrated Circuits Conference.
Hamasaki et al; "A 3-V, 22-mV Multibit Current Mode $\Sigma\Delta$ DAC with 100 dB Dynamic Range"; Dec. 1996, pp. 1888-1894.
Harald et al; "Design of a 10-bit 100 MSamples/s BiCMOS D/A Converter", 1996, pp. 730-733.
He et al; "A DSP Receiver for 1000 Base-T PHY", 2001, IEEE Solid State Circuits Conf. Feb. 2001.
Hellums et al; "An ADSL Integrated Active Hybrid Circuit", no date available.
Hellwarth et al; "Digital-to-analog Converter having Common-mode Isolation and Differential Output", IBM Journal of Research & Development Jan. 1973.
Henriques et al; "A CMOS Steering-Current Multiplying Digital-to-Analog Converter"; 1995, pp. 145-155.
Hester et al; "CODEC for Echo-Canceling Full-Rate ADSL Modems"; Dec. 1999.
Horowitz et al; "High-Speed Electrical Signaling: Overview and Limitations", 1998, p. 12-24, IEEE.
Hu et al; "A Monolithic 480 Mb/s Parallel AGC/Decision/Clock-Recovery Circuit in 1.2- $\mu$m CMOS"; Dec. 1993, pp. 1314-1320.
Hung et al; "A 1.24-GHz Monolithic CMOS VCO with Phase Noise of 137 dBc/Hz at a 3-MHz Offset"; 1999, pp. 111-113.
IEEE Standards 802.3: Part 3 Carrier Sense Multiple Access with Collision Detection (CSMA/CD) Access Method and Physical Detection; Mar. 8, 2002, pp. 1-1538.
IEEE Standards 802.3ab-2002, "Part 3: Carrier sense multiple access with collision detection (CSMA/CD) access method and physical layer specifications", pp. 147-249, Mar. 2002.
Intersil, HC-5509B ITU CO/Loop Carrier SLIC, Aug. 2003.
Jansen et al; SP 23.8: Silicon Bipolar VCO Family for 1.1 to 2.2 GHz with Fully-Integrated Tank and Tuning Circuits, Feb. 8, 1997, 392-393, 492.
Johns et al; "Integrated Circuits for Data Transmission Over Twisted Pair Channels", Mar. 1997, pp. 398-406.
Johnson et al; "THAM 11.2: A Variable Delay Line Phase Locked Loop for CPU-Coprocessor Synchronization", IEEE Solid State Circuits Conf. Feb. 1988 pp. 142-143, 334-335.
Jorgensen, Ivan et al; "Design of a 10-big 100 MSamples/s BICMOS D/A Converter", 1996, pp. 730-733, IEEE.
Kelly, N. Patick et al; "WA 18.5—A Mixed-Signal DFE/FFE Receiver for 100Base-TX Applications", ISSCC 2000/Session 18/Wireline Communications/Paper WA 18.5, 2000 IEEE International Solid-State Circuits Conference, pp. 310-311, month unknown 2000.
Kim et al; "A 30-MHz Hybrid Analog/Digital Clock Recovery Circuit in 2-um CMOS", 1990, pp. 1385-1394.
Kim et al; "A Low-Power Small-Area 7.28-ps-Jitter 1-GHz DLL-Based Clock Generator", IEEE Journal of Solid State Circuits, Nov. 2002 vol. 37 No. 11 pp. 1414-1420.
Kim et al; PLL/DLL System Noise Analysis for Low Jitter Clock Synthesizer Design, 31-34, May 1994; 1994 IEEE Int. Symposium on Circuit & Systems.
Kinget, FP 14.7: A Fully Integrated 2.7V 0.35 $\mu$m CMOS VCO for 5 GHz Wireless Applications, Feb. 5, 1998, IEEE.
Knight, Jr. et al; A Self-Terminating Low-Voltage Swing CMOS Output Driver, 1988, 457-464.
Koullias et al; "TP 9.2: MHz Transceiver Chip Set for Dual-Mode Cellular Radio Mobile Terminals", 1993, pp. 140-141, 278.
Lam et al; "WP 23.6: A 2.6 GHz/5.2 GHz CMOS Voltage-Controlled Oscillator", 1999, pp. 402-403, 484.
Lee et al; "A 2.5 V CMOS Delay-Locked Loop for an 18 Mbit, 500 Megabytes/s DRAM"; 1994, pp. 1491-1496.
Lee et al; "A 3V 10b 100 MS/s Digital-to-Analog Converter for Cable Modem Applications", Aug. 28-30, 2000; pp. 203-205.
Lee et al; "A CMOS Serial Link for Fully Duplexed Data Communication", Apr. 1995, IEEE Journal of Solid State Circuits vol. 30 No. 4.
Lee et al; "A Fully Integrated Low-Noise 1-GHz Frequency Synthesizer Design for Mobile Communication Applicaion"; May 1997, pp. 760-765, IEEE JSSC.
Letham et al; "A high-performance CMOS 70-Mhzpalette/DAC", Dec. 1987, pp. 1041-1047 IEEE JSSC.
Liberali et al; "Progress in High-Speed and High-Resolution CMOS Data Converters", Sep. 12-14, 1995, pp. 19-28.
Lin et al; "A 10-b, 500-Msample/s CMOS DAC in 0.6mm2"; Dec. 1996; 11 pages, IEEE.
Lin et al; A Register-Controller Symmetrical DLL for Double-Data-Rate DRAM, IEEE Journal Solid State Circuits Apr. 1999 pp. 565-568.
Lin et al; "TP 12.5: A 1.4 GHz Differential Low-Noise CMOS Frequency Synthesizer using a Wideband PLL Architecture"; 2000, pp. 204-205, 458.
Linear Technology, "High Speed Modem Solutions", InfoCard 20, Linear Technology Corporation, date unknown.
Linear Technology, LT1355/LT1356, Dual and Quad 12MHz, 400V/us Op Amps, Linear Technology Corporation, pp. 1-16, date unknown.
Linear Technology, LT1358/LT1359, Dual and Quad 25MHz, 600V/us Op Amps, Linear Technology Corporation, pp. 1-12, date unknown.
Linear Technology, LT1361/LT1362, Dual and Quad 50MHz, 800V/us Op Amps, Linear Technology Corporation, pp. 1-12, date unknown.
Linear Technology, LT1364/LT1365, Dual and Quad 70MHz, 1000V/us Op Amps, Linear Technology Corporation, pp. 1-12, date unknown.
Linear Technology, LT1813/LT1814, Dual and Quad 3mA, 100MHz, 750V/us Op Amps, Linear Technology Corporation, pp. 1-16, date unknown.
Liu et al; "WP 23.7: A 6.5 GHz Monolithic CMOS Voltage-Controlled Oscillator", 1999, pp. 404-405, 484.
Maneatis, John G., FA 8.1: Low-Jitter Process-Independent DLL and PLL Based on Self-Biased Techniques, Nov. 1996, 1723-1732.
Mano, " Digital Logic and Computer Design", copyright 1979 Prentice Hall.
Marshall et al; "TA 8.7: A 2.7V GSM Transceiver ICs with On-Chip Filtering", 1995, IEEE International Solid State Circuits Conference.
Miki et al; "An 80-MHz 8-bit CMOS D/A Converter", Dec. 1986, pp. 983-988.
Millman et al; "Pulse, Digital, and Switching Waveforms", pp. 674-675, no date.
Moon, Yongsam et al; "An All-Analog Multiphase Delay-Locked Loop Using a Replica Delay Line for Wide-Range Operation and Low-Jitter Performance", IEEE Jounral of Solid-State Circuits, vol. 35, No. 3, Mar. 2000, pp. 377-384.

Mueller, K.H.; "Combining Echo Cancellation and Decision Feedback Equalization", The Bell System Technical Journal, vol. 58, No. 2, Feb. 1979, pp. 491-500.

Munshi et al; "Adaptive Impedance Matching"; 69-72, no date.

Myson Technology; "MTD214—Ethernet Encoder/Decoder and 10BaseT Transceiver with Built-in Waveform Shaper"; 1997, pp. 1-11.

Myson Technology; "MTD972 (Preliminary) 100BaseTX PCS/PMA", 1997, pp. 1-21.

Nack et al; "A Constant Slew Rate Ethernet Line Driver", May 2001.

Nakamura et al; "A 10-b 70-MS/s CMOS D/A/ converter", Apr. 1991, pp. 637-642.

Narayanan et al; "Doppler Estimation Using a Coherent Ultrawide-Band Random Noise Radar", Jun. 2000, IEEE Transactions on Antennas & Propogation vol. 48 No. 6.

Nguyen et al; "Si IC-Compatible Inductors and LC Passive Filters", Aug. 1990, pp. 1028-1031.

Niknejad et al; "Analysis and Optimization of Monolithic Inductors and Transformers for RF ICs", 1997, pp. 375-378, IEEE Custom Integrated Circuits Conference.

Niknejad et al; "Analysis, Design, and Optimization of Spiral Inductors and Transformers for Si RF IC's", Oct. 1998, pp. 1470-1481.

Niknejad et al; Numerically Stable Green Function for Modeling and Analysis of Substrate Coupling in Integrated Circuits, Apr. 1998, 305-315, IEEE.

Parameswaran et al; "A New Approach for the Fabrication of Micromechanical Structures", Dec. 6, 1998, pp. 289-307, I.

Park et al; "A Low-Noise, 900 MHz VCO in 0.6 μm CMOS"; May 1999, pp. 586-591.

Parker et al; "A Low-Noise 1.6-GHz CMOS PLL with On-Chip Loop Filter"; 1997, pp. 407, 409-410.

Phillips, The HC-5502X14X Telephone Subscriber Line Interface Circuits (SLIC), Jan. 1997.

Radke et al; "A 14-Bit Current-Mode ΣΔ DAC Based Upon Rotated Data Weighted Averaging"; Aug. 2000, pp. 1074-1084.

Rao, Sailesh; Short Course: Local Area Networks, International Solid State Circuits Conference; Sailesh Rao; Outline Implementing Gigabit Ethernet Over Cat-5 Twisted-Pair Cabling; Jack Kenny; Signal Processing and Detection in Gigabit Ethernet; 3 pages, no date.

Razavi; "Principles of Data Conversion System Design", Textbook IEEE Press 1995.

Razavi; "SP 23.6: A 1.8 GHz CMOS Voltage-Controlled Oscillator"; 1997, pp. 388-389.

Regan, "ADSL Line Driver/Receiver Design Guide", Part 1, Feb. 2000, Linear Technology Magazine.

Reynolds, "A 320 MHz CMOS triple 8b DAC with on-chip PLL and hardware cursor", Feb. 1994, pp. 50-51.

Rofougaran et al; "SP 24.6: A 900 MHz CMOS LC-Oscillator with Quadrature Outputs", 1996.

Roo et al; "A CMOS Transceiver Analog Front-end for Gigabit Ethernet over Cat-5 Cables", 2001.

Rudell et al; "A 1.9-GHz Wide-Band IF Double Conversion CMOS Receiver for Cordless Telephone Applications", 1997, pp. 2071-2088, IEEE JSSC Dec. 1997 vol. 32 No. 12.

Rudell et al; Recent Developments in High Integration Multi-Standard CMOS Transceivers for Personal Communication Systems, 1998, 149-154, © 1998 ACM.

Rudell et al; "SA 18.3: a 1.9 GHZ Wide-band IF Double Conversion CMOS Integrated Receiver for Cordless Telephone Applications", 1997, pp. 304-305, 476, Feb. 1997.

Sato et al; "SP 21.2: A 1.9 GHz Single-Chip IF Transceiver for Digital Cordless Phones", Feb. 10, 1996.

Sedra et al, "Microelectronic Circuits", 3rd Edition, 1991; 70 pages.

Sedra et al; "Micro-Electronic Circuits", 1982, pp. 95-97 and 243-247.

Sedra et al; "microelectronic Circuits", Third Edition, 1991, pp. 48-115.

Sedra et al; "Microelectronic Circuits", Third Edition, 1991, pp. 86-92.

Sedra et al; "Microelectronic Circuits," Third Edition, Chapter 2: Operational Amplifiers, Section 2.4; pp. 61-63, 1991.

Shoaei et al; "A 3V Low Power 0.25 μm CMOS 100 Mb/s Receiver for Fast Ethernet", 2000.

Shoval et al; A 100 Mb/s BiCMOS Adaptive Pulse-Shaping Filter, Dec. 1995, 1692-1702.

Shoval et al; "A CMOS Mixed-Signal 100Mb/s Receive Architecture for Fast Ethernet", 1999.

Shoval et al; "WA 18.7—A Combined 10/125 Mbaud Twisted-Pair Line Driver with Programmable Performance/Power Features," 2000, pp. 314-315.

Shui et al; "Mismatch Shaping for a Current-Mode Multibit Delta-Sigma DAC", Mar. 1999; pp. 331-338.

Song et al; "FP 12.1: NRZ Timing Recovery Technique for Band-Limited Channels"(Slide Supplement), 1996.

Song et al; FP 12.1: NRZ Timing Recovery Technique for Band-Limited channels, 1996, IEEE ISSCC 1996.

Song, "Dual Mode Transmitter with Adaptively Controlled Slew Rate and Impedance Supporting Wide Range Data Rates," 2001.

Song, Bang-Sup et al; "FP 12.1: NRZ Timing Recovery Technique for Band-Limited Channels", ISSCC 96/Session 12/Serial Data Communications/Paper FP 12.1, 1996 IEEE International Solid State Conference, pp. 194-196.

Sonntag et al; "FAM: 11.5: A Monolithic CMOS 10 MHz DPLL for Burse-Mode", IEEE Solid State Circuits Conference, Feb. 1990.

Soyuer et al; "A Monolithic 2.3-Gb/s 100/mW Clock and Data Recovery Circuit in Silicon Bipolar Technology", Dec. 1993, pp. 1310-1313.

Stephens, "Active Output Impedance for ADLS Line Drivers", Nov. 2002.

Stonick et al; An Adaptive PAM-4 5-Gb/s Backplane Transceiver in 0.25-um CMOS; IEEE Journal of Solid-State Circuits, vol. 38, No. 3, Mar. 2003; pp. 436-443.

Su et al; "A CMOS OVersampling D/A Converter with a Current-Mode Semidigital Reconstruction Filter", Dec. 1993, pp. 1224-1233.

Su et al; "Experimental Results and Modeling Techniques for Substrate Noise in Mixed-Signal Integrated Circuits", Apr. 1993, pp. 420-430.

Takakura et al; "A 10 bit 80 MHz glitchless CMOS D/A/ converter", May 1991, pp. 26.5.1-26.5.4, 1991 IEEE Custom Integrated Circuits Conference.

Techdictionary.com definition of decoder, Link: http://www.techdictionary.com; 1 page, Dec. 2005.

Tham, Joo Leong et al; "A 2.7-V 900 MHz/1.9-GHz Dual-Band Transceiver IC for Digital Wireless Communication", 1999, pp. 286-291.

The Autoritative Dictionary of IEEE Standards Sterns 7th Edition, p. 280, no date.

The Electrical Engineering Handbook, Chapter 31, "D/A and A/D Converters", Richard C. Dorf, editor, CRC Press, 1993.

Tsutomu Kamoto; "An 8-bit 2-ns Monolithic DAC", Feb. 1988.

Uda et al; "125Mbit/s Fiber Optic Transmitter/Receiver with Duplex Connector", Fiber Optic Communications Development Div. NEC Corporation, NEC Engineering, Ltd. and English Language Translation, no date available.

University of Pennsylvania CSE Digital Logic Lab re decoders. Link: http://www.cse,dmu.ac.uk[ sexton/WWW/Pages/cs2.html; 3 pages, no date given; printed Dec. 2005.

Van de Plassche; "Integrated Analog-to-Digital and Digital-to-Analog Converters—Chapter 6", pp. 211-271, no date.

Van der Plas et al; "A 14-Bit Intrinsic Accuracy Q2 Random Walk CMOS DAC", Dec. 1999, pp. 1708-1718.

Waizman; "FA 18.5; A Delay Line Loop for Frequency Synthesis of De-Skewed Clock"; Feb. 18, 1994, pp. 298-299.

Walker et al; A Two Chip 1.5 GBd serial Link Interface, Dec. 1992, IEEE JSSC.

Wang et al; A 1.2 GHz programmable DLL-Based Frequency Multiplier for Wireless Applications; Dec. 2004.

Wang et al; "WP 23.8: A 9.8 GHz Back-Gate Tuned VCO in 0.35 um CMOS", 1999, pp. 406-407, 484.

Wang, HongMo; "WP 23.8: A 9.8 GHz Back-Gate Tuned VCO in 0.35 μm CMOS", ISSCC99, Session 23, Paper WP 23.8 1999 IEEE International Solid-State Circuits Conference, pp. 406-407, 484, Feb. 1999.

Weaver, Jr.; "A Third Method of Generation and Detection of Single-Sideband Signals", Dec. 1956, pp. 1703-1705.

Weigandt et al; "Analysis of Timing Jitters in CMOS Ring Oscillators"; pp. 27-30, IEEE Symposium on Circuits & Systems May 1994.

Wikner et al; "Modeling of CMOS Digital-to Analog Converters for Telecommunication"; May 1999, pp. 489-499.

Wu et al; "A low glitch 10-bit 75 MHz CMOS video D/A converter", Jan. 1995, pp. 68-72.

Yamaguchi et al; "400Mbit/s Submarine Optical Repeater Using Integrated Circuits", Fujitsu Laboratories Ltd. and English Language Translation, no date available.

Yee et al; "An Integratable 1-2.5 Gbps Low Jitter CMOS Transceiver with Built in Self Test Capability", 1999.

Young et al; "A Low-Noise RF Voltage-Controlled Oscillator Using On-Chip High-Q Three-Dimensional Coil Inductor and Micromachined Variable Capacitor"; Jun. 8-11, 1998, pp. 128-131.

Young et al; "A Micromachined Variable Capacitor for Monolithic Low-Noise VCOS"; 1996, pp. 86-89, month unknown.

Young et al; "Monolithic High-Performance three-Dimensional Coil Inductors for Wireless Communications", 1997, month unknown.

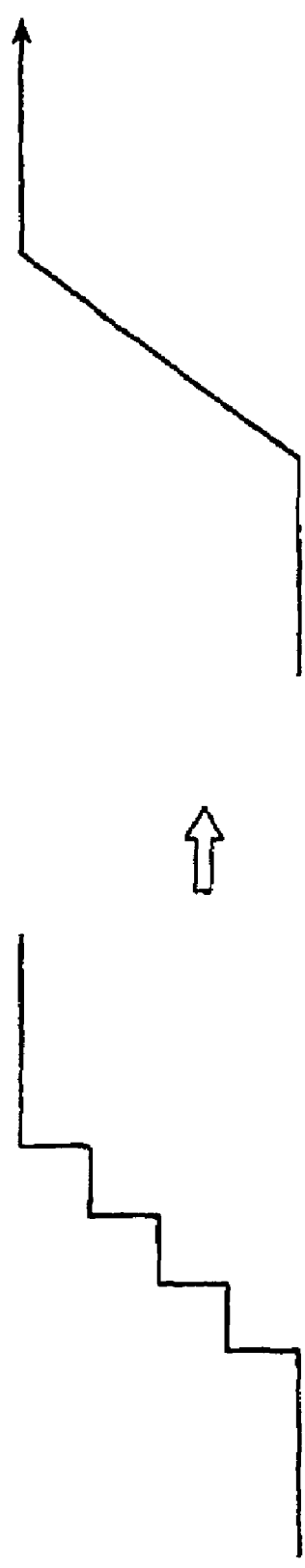
FIG. 15a
FIG. 15b

COMMUNICATION DRIVER

CROSS-REFERENCE TO RELATED APPLICATIONS

This application is a continuation of U.S. Non-Provisional patent application Ser. No. 11/178,350, filed on Jul. 12, 2005 (now U.S. Pat. No. 7,113,121), which is a continuation of U.S. Non-Provisional patent application Ser. No. 11/106, 497, filed Apr. 15, 2005 (now U.S. Pat. No. 7,095,348), which is a continuation of U.S. Non-Provisional patent application Ser. No. 10/972,143, filed Oct. 25, 2004, which is a continuation of U.S. Non-Provisional patent application Ser. No. 10/191,924, filed Jul. 8, 2002 (now U.S. Pat. No. 6,844,837), which is a continuation-in-part of U.S. Non-Provisional patent application Ser. No. 09/920,241, filed Aug. 1, 2001, and is a continuation-in-part of U.S. Non-Provisional patent application Ser. No. 09/737,474, filed Dec. 18, 2000 (now U.S. Pat. No. 6,462,688) and U.S. Non-Provisional patent application Ser. No. 10/972,143, filed Oct. 25, 2004, is a continuation-in-part of U.S. Non-Provisional patent application Ser. No. 09/737,743, filed Dec. 18, 2000 (now U.S. Pat. No. 7,194,037), which claims benefit of U.S. Provisional Application Ser. No. 60/206,409, filed May 23, 2000, and claims benefit of U.S. Provisional Application Ser. No. 60/211,571, filed Jun. 15, 2000 and said U.S. Non-Provisional patent application Ser. No. 10/972, 143, filed Oct. 25, 2004, is a continuation-in-part of U.S. patent application Ser. No. 09/629,092, filed Jul. 31, 2000 (now U.S. Pat. No. 6,775,529), the entire contents of which are incorporated by reference herein.

BACKGROUND OF THE INVENTION

The present invention relates generally to data communication. More particularly, the present invention relates to a Class B line driver for communication channels such as those present in an Ethernet network.

BACKGROUND INFORMATION

Digital-to-analog conversion involves the process of converting digital codes into a continuous range of analog signal levels (voltage or current), for example, as discussed in Chapter 31, "D/A and A/D Converters" of The Electrical Engineering Handbook, ed. Richard C. Dorf, CRC Press 1993, the contents of which are hereby incorporated by reference. A digital-to-analog converter (hereinafter a DAC) is generally an electronic circuit that receives an n-bit codeword from an interface and generates an analog voltage or current that is proportional to the codeword.

One example of a DAC is discussed in U.S. Pat. No. 5,663,728, entitled A Digital-To-Analog Converter (DAC) and Method that set Waveform Rise and Fall Times to Produce an Analog Waveform that Approximates a Piecewise Linear Waveform to Reduce Spectral Distortion, issued on Sep. 2, 1997, the contents of which are hereby incorporated by reference. The DAC of the U.S. Pat. No. 5,663,728 patent employs a waveform shaping circuit to control the rise and fall times of each component waveform so that the analog waveform rising and falling edges settle to within a desired error bound of a linear output ramp.

U.S. Pat. No. 5,936,450, entitled A Waveshaping Circuit Using Digitally Controlled Weighted Current Summing, issued on Aug. 10, 1999, the contents of which are hereby incorporated by reference, discloses a waveshaping circuit. The waveshaping circuit of the U.S. Pat. No. 5,936,450 patent includes a controller and a current summing circuit controlled by the controller. The current summing circuitry selectively sinks combinations of component currents in response to a sequence of control signal sets to generate an output current signal having a desired waveform.

Many DACs attempt to generate desired signal waveform in response to a digital signal. For the purposes of this discussion, a signal output may include the output of a DAC and/or the output of one or more signal components within a DAC. For example, a signal component may correspond to an individual bit of a codeword. One conventional method generates a signal output with a slew rate controlled current source, as shown in FIG. 1. The voltage V measured across a resistor R is shown in FIG. 2. The waveform V includes sharp transition areas (e.g., corners) 1, 2 and 3, which may introduce electromagnetic interference. Such interference may inhibit accurate signal processing.

Another circuit which generates an output signal employs a current mirror 10 having an RC filter, as illustrated in FIG. 3. A current source I drives the current mirror 10. Current mirror 10 includes a first transistor 11 and a second transistor 12. Transistors 11 and 12 are preferably CMOS transistors. The first transistor 11 includes gate-to-drain feedback, and is coupled to transistors 12 through the RC filter. The RC filter limits rise and fall times of the input signal I. However, the R and C components are typically process and/or temperature dependent. Such dependence causes variation in the output waveform as shown in FIG. 4. The dashed lines in FIG. 4 represent arbitrary output responses due to temperature and/or process variation. A stable output signal is difficult to obtain with such a circuit.

Many older communications technologies employ bi-level signals, where each signal can have one of only two levels. However, newer communications technologies employ signals having many levels. One such technology, Gigabit Ethernet, employs signals having 17 levels. FIG. 5 depicts a D/A circuit capable of producing such multi-level signals. The D/A circuit of FIG. 5 employs a DAC 32, a low pass filter 34, an operational amplifier 36, a transistor 38, and a resistor 39. Each level of a multilevel input signal is provided to DAC 32 for conversion to an analog signal. The LPF 34 then determines the rise time of the output of the DAC 32, and the output is passed to operational amplifier 36. This construction presents two problems. First, the R and C values of LPF 34 will vary with temperature and process variations, and the output signal will have a poor waveshape where the rise times are not constant. Second, since all input current is passed through the same DAC, and since bandwidth is a function of current level, each level of the multilevel signal will present a different rise time. This second problem is illustrated in FIG. 24.

FIG. 24 shows a waveform produced by the D/A circuit of FIG. 5 where DAC 32 has four levels. Because the bandwidth of the circuit is a function of the signal level provided to the non-inverting input of operational amplifier 36, the slew rate differs for each signal level. Referring to FIG. 24 for example, the bandwidth for the transition from the 0 signal level to the 1 signal level is low, resulting in a low slew rate and a long rise time $t_1$. In contrast, the bandwidth for the transition from the 2 signal level to the 3 signal level is high, resulting in a high slew rate and a short rise time $t_2$.

These signal processing problems are not adequately addressed in the art. Accordingly, there is a need for a current source to control an output signal which is independent of temperature and process considerations. There is also a need for a DAC to generate a signal having selectable

3 transition areas (corners). There is a further need of a circuit to generate desirable waveshapes.

SUMMARY OF THE INVENTION

An Ethernet controller includes a decoder, and T sets of transmit circuits. Each set of transmit circuits receives one of T decoded signals from the decoder, and includes a digital-to-analog converter (DAC) that provides a transmit output signal, and a replica circuit that provides a replica output signal. Each DAC includes N current sources arranged in parallel and differentially, and M delay elements. Each current source includes a control input. A sum of outputs of the N current sources forms each transmit output signal. An input of the first delay element and the control input of the first current source receive a decoded signal. An input of an mth delay element is in communication with an output of an m−1th delay element. The output of each delay element controls a corresponding control input of a current source. A sum of the transmit output signals forms an accumulated output signal.

The details of one or more implementations are set forth in the accompanying drawings and the description below. Other features will be apparent from the description and drawings, and from the claims.

BRIEF DESCRIPTION OF THE DRAWINGS

FIG. 15a is a graphical depiction of a waveform generated with uniform delay elements.

FIG. 15b is a graphical depiction of a waveform generated with non-uniform delay elements.

4

Figure 18:
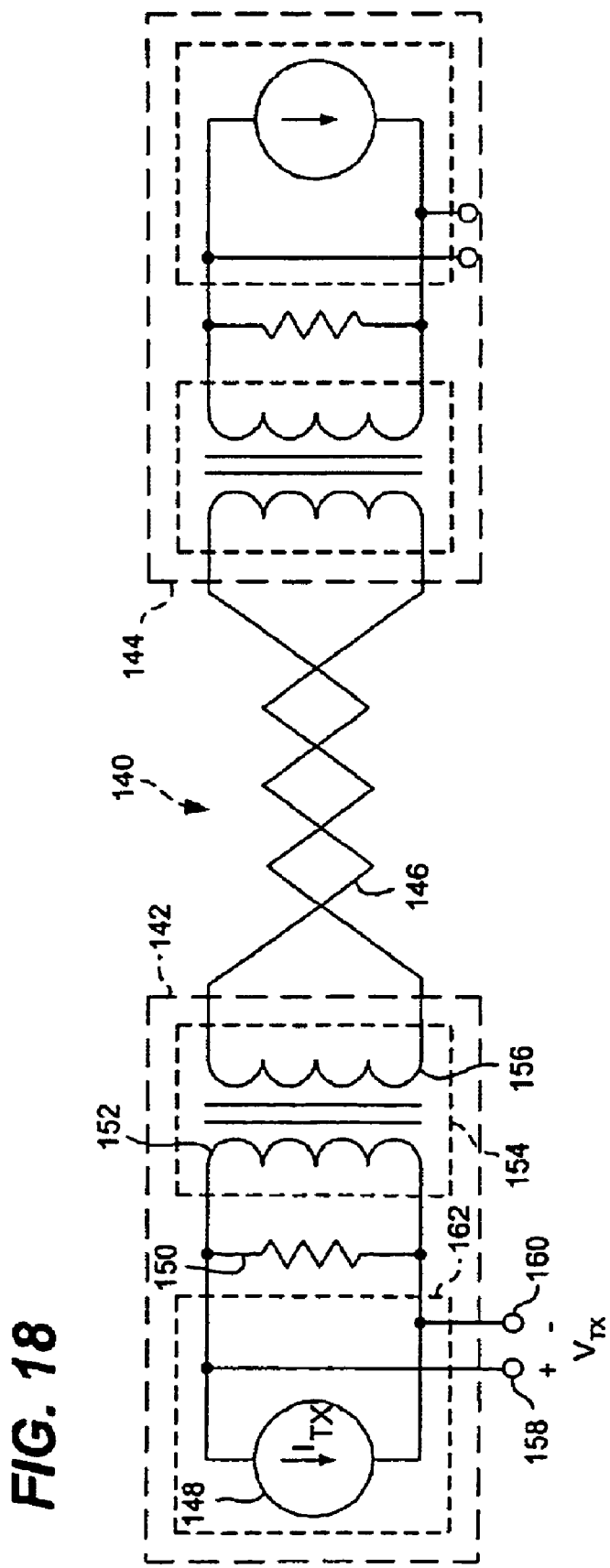
Figure 19:
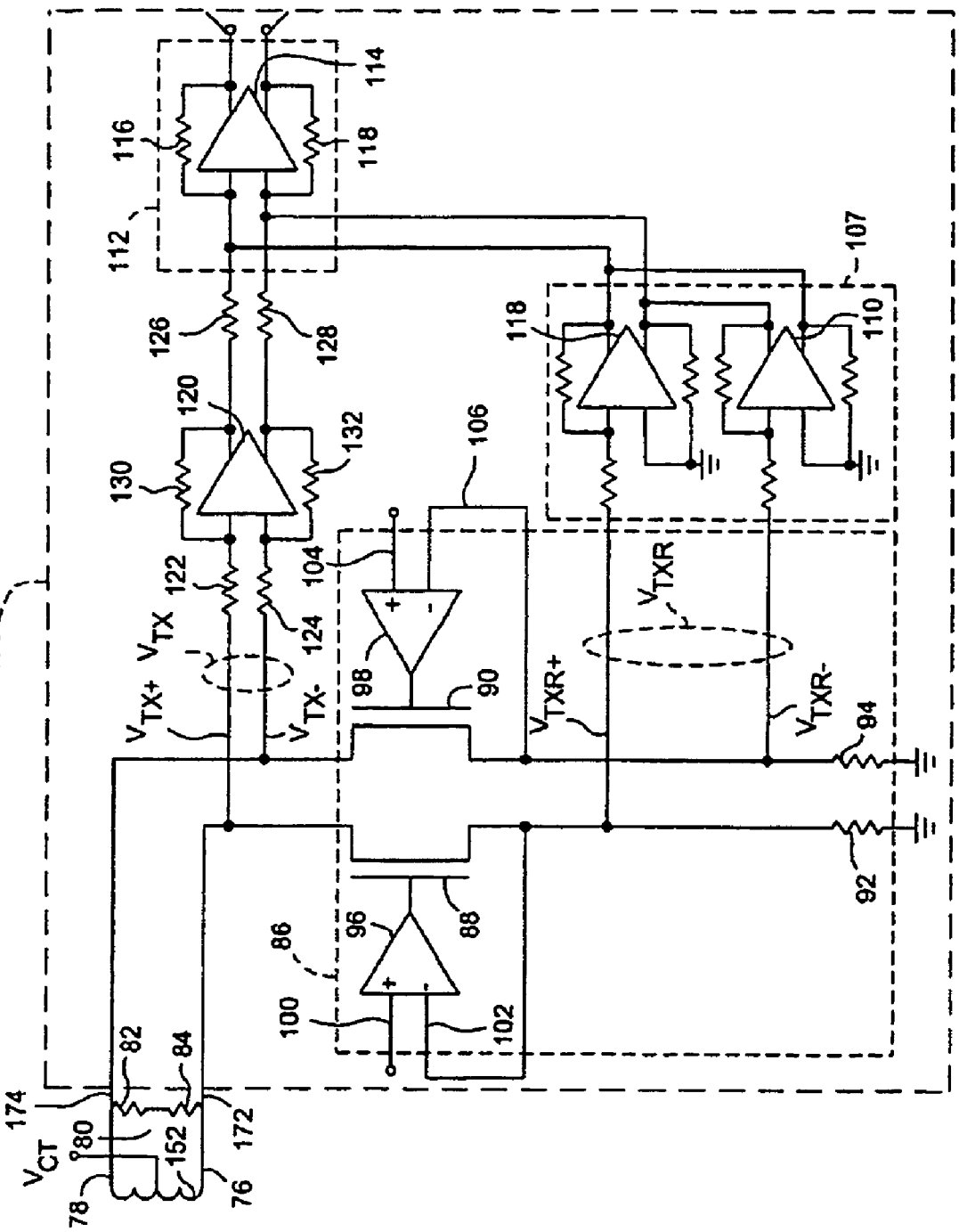
Figure 20:
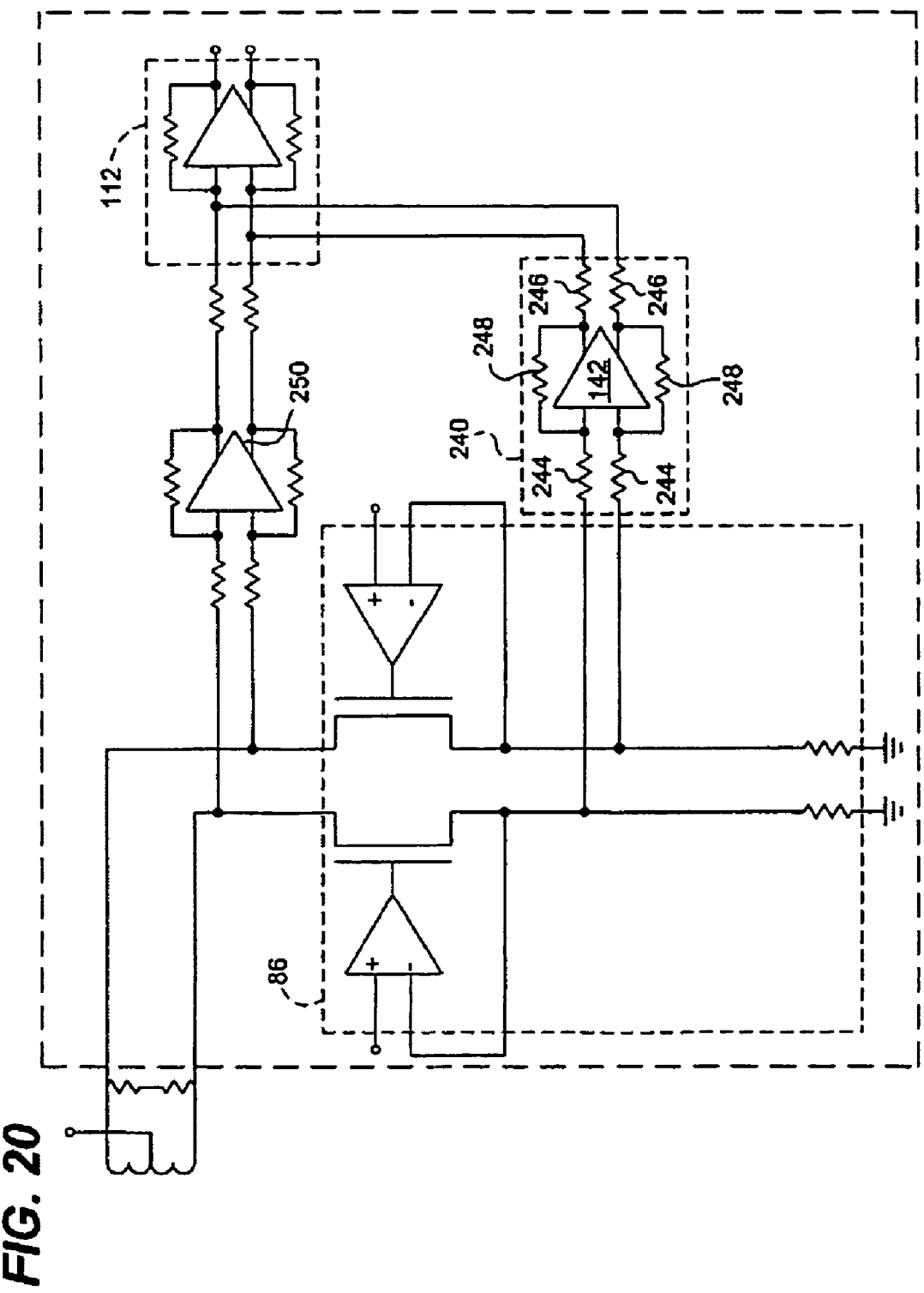

FIG. 18 is a high-level schematic diagram illustrating a communication channel in connection with which the method and apparatus of the present invention may be used;

FIG. 19 is a detailed schematic diagram illustrating one embodiment of a transceiver according to the principles of the present invention; and FIG. 20 is a detailed schematic diagram illustrating a second embodiment of a transceiver according to the principles of the present invention.

Figure 21:
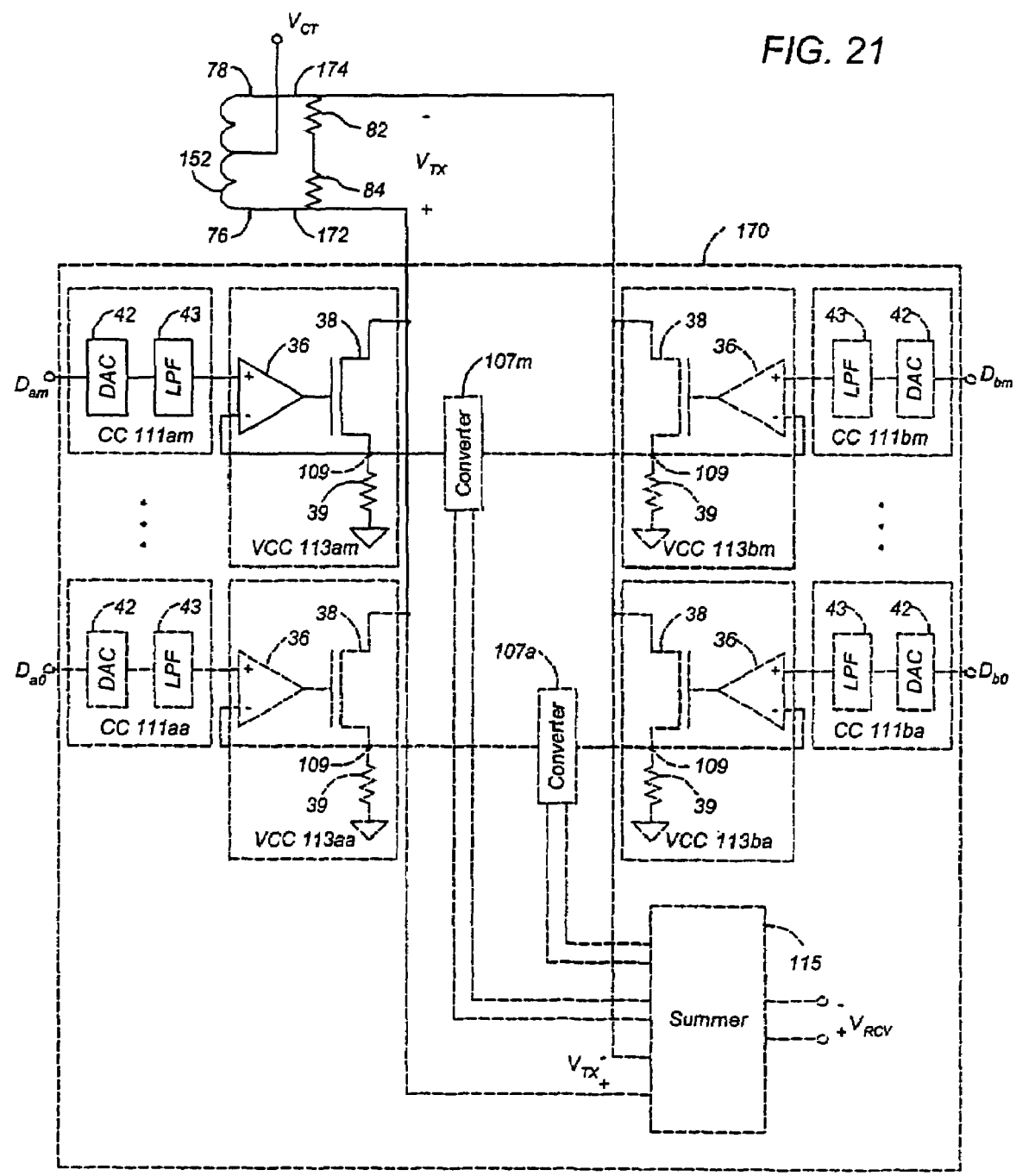

FIG. 21 is a detailed schematic diagram illustrating a third embodiment of a transceiver according to the principles of the present invention.

Figure 22:
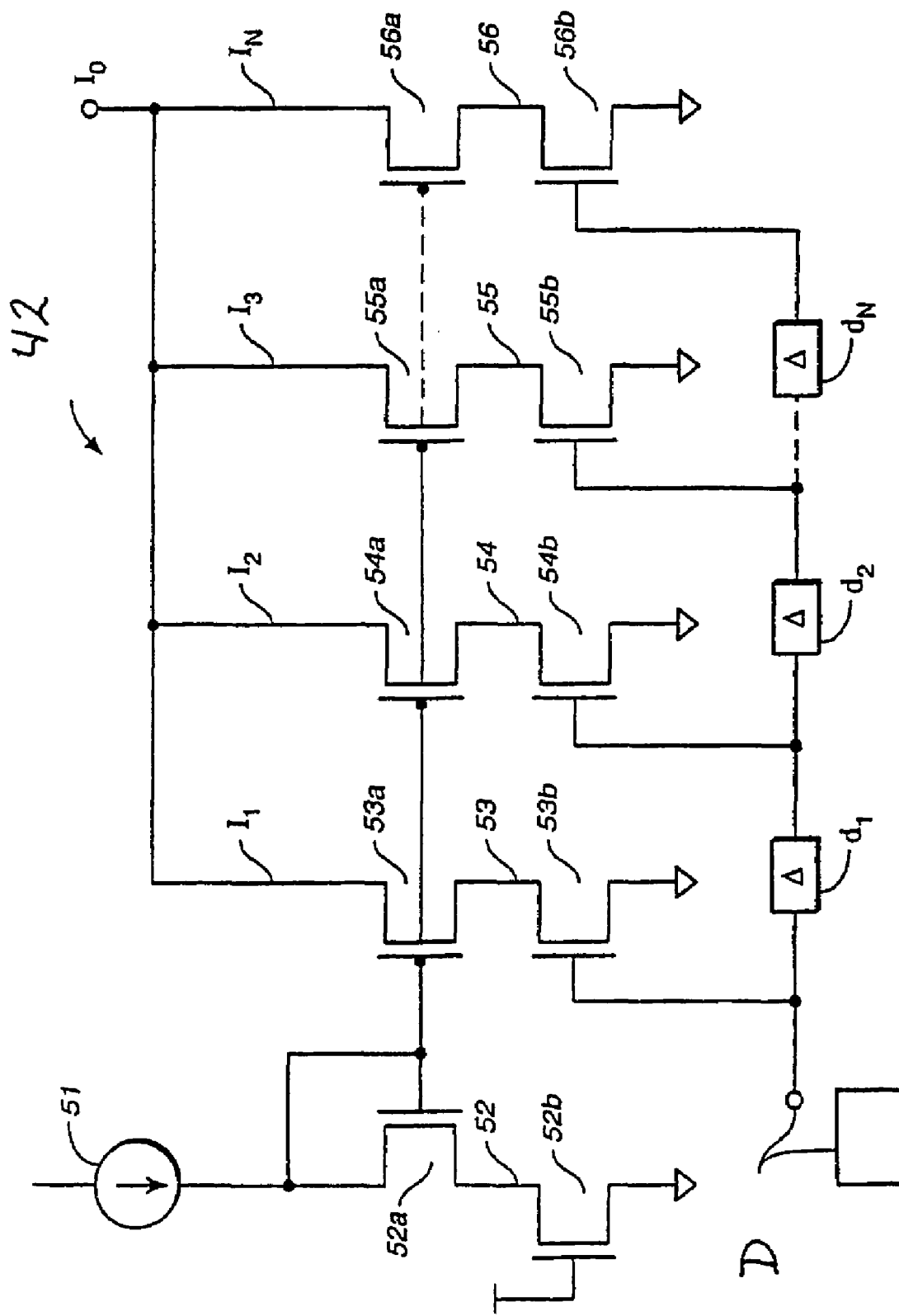

FIG. 22 shows detail of a DAC according to some implementations.

Figure 23:
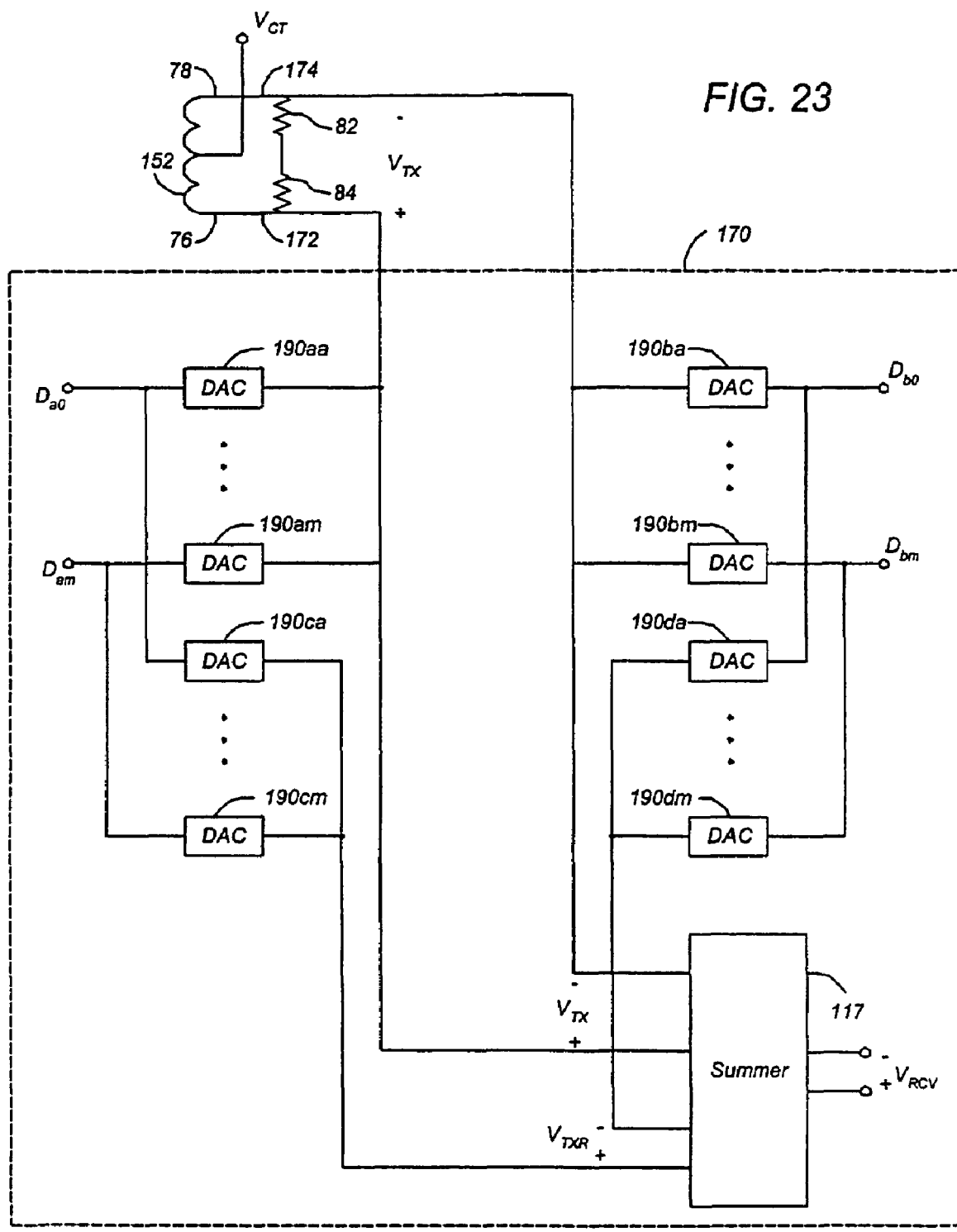

FIG. 23 is a detailed schematic diagram illustrating a fourth embodiment of a transceiver according to the principles of the present invention.

Figure 5:
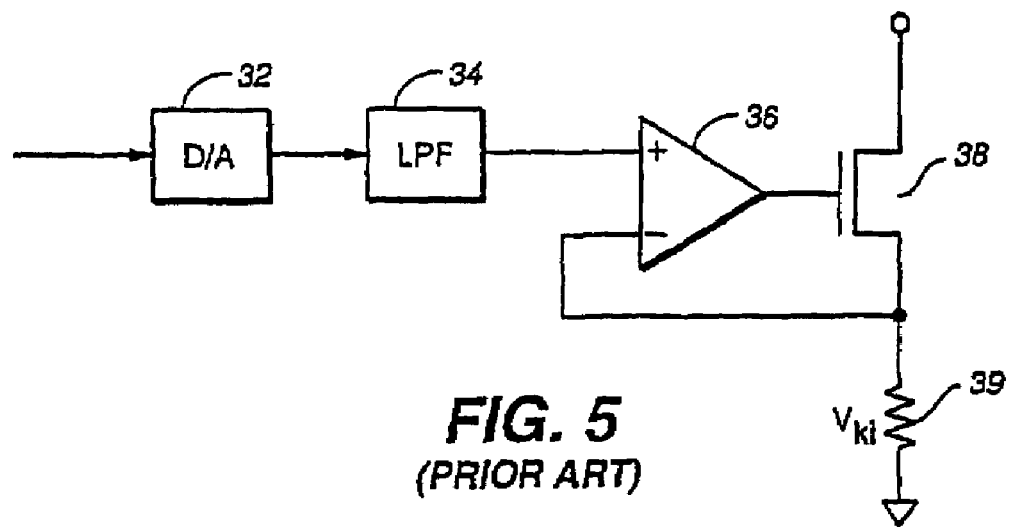
FIG. 5 is a schematic block diagram of a D/A circuit.
Figure 24:
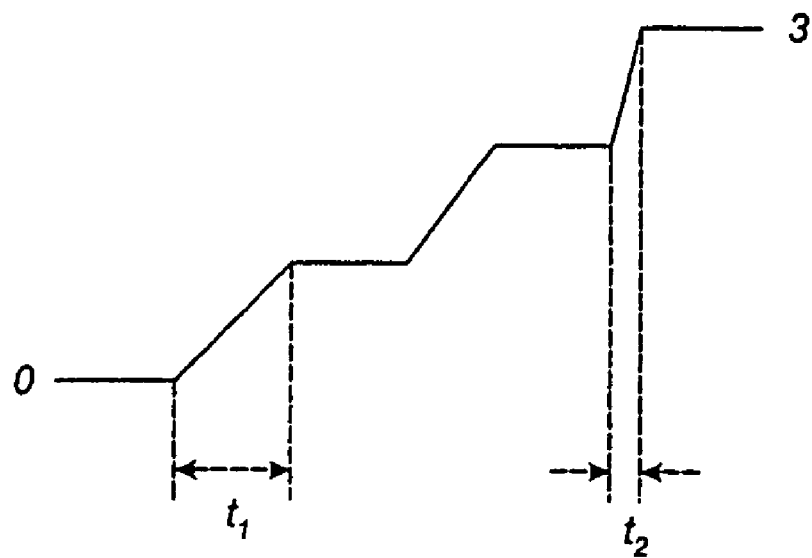

FIG. 24 shows a waveform produced by the D/A circuit of FIG. 5.

Figure 25:
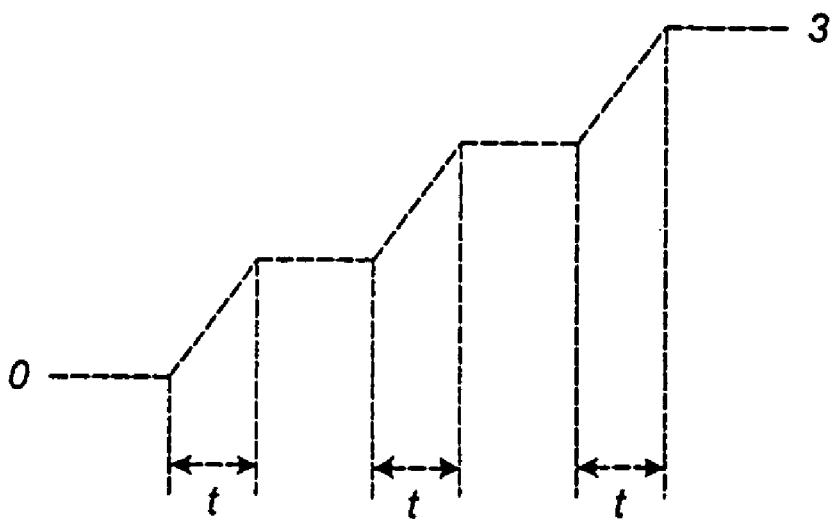

FIG. 25 shows a waveform produced by the circuit of FIG. 21.

Figure 26:
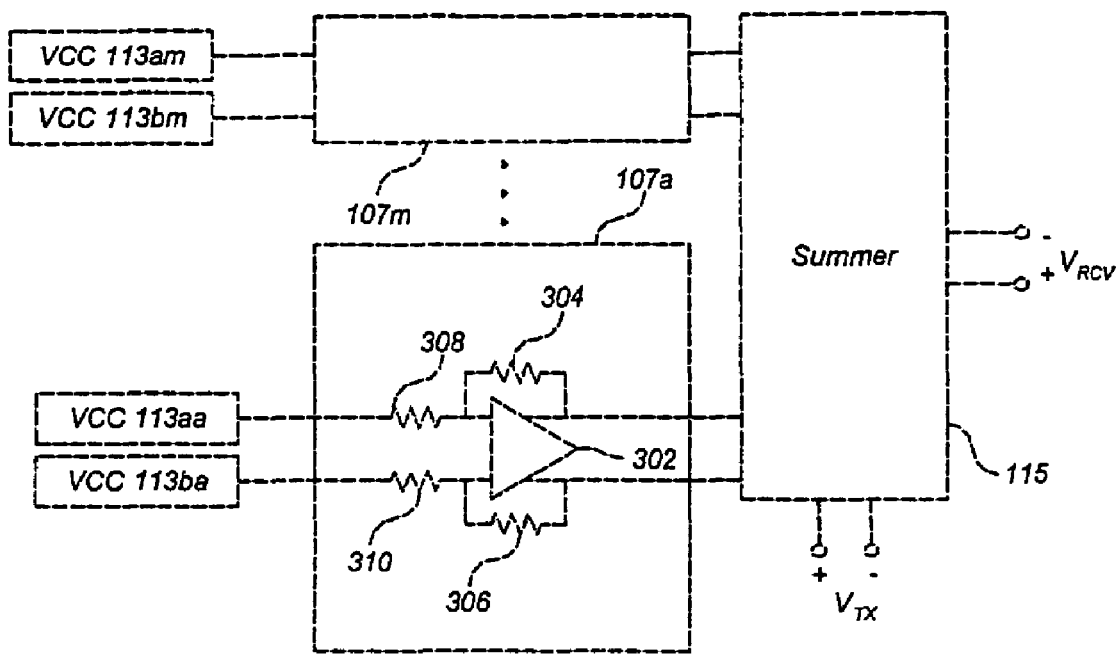

FIG. 26 shows detail of a converter according to one implementation.

Figure 27:
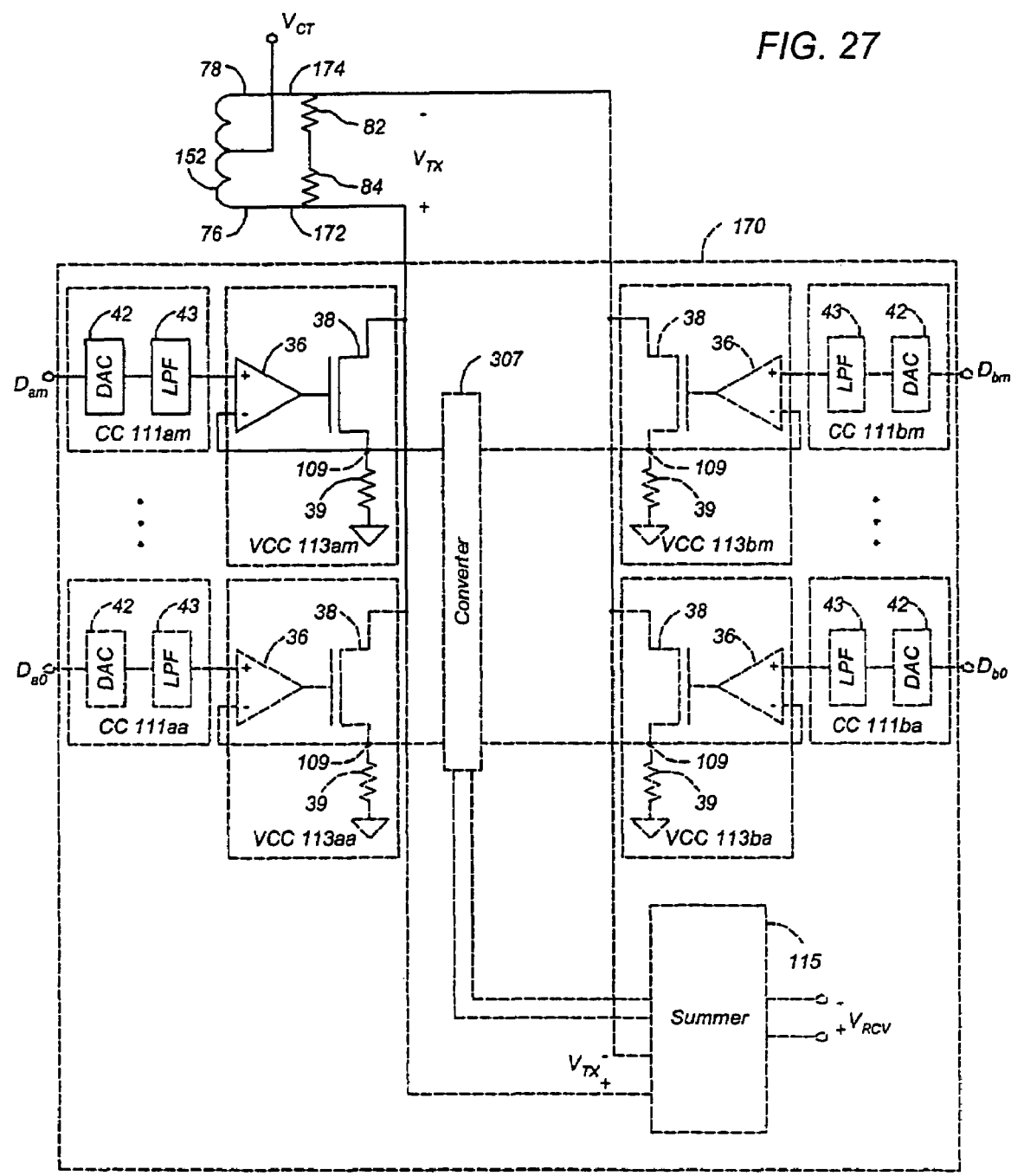

FIG. 27 is a detailed schematic diagram illustrating a fifth embodiment of a transceiver according to the principles of the present invention.

Figure 28:
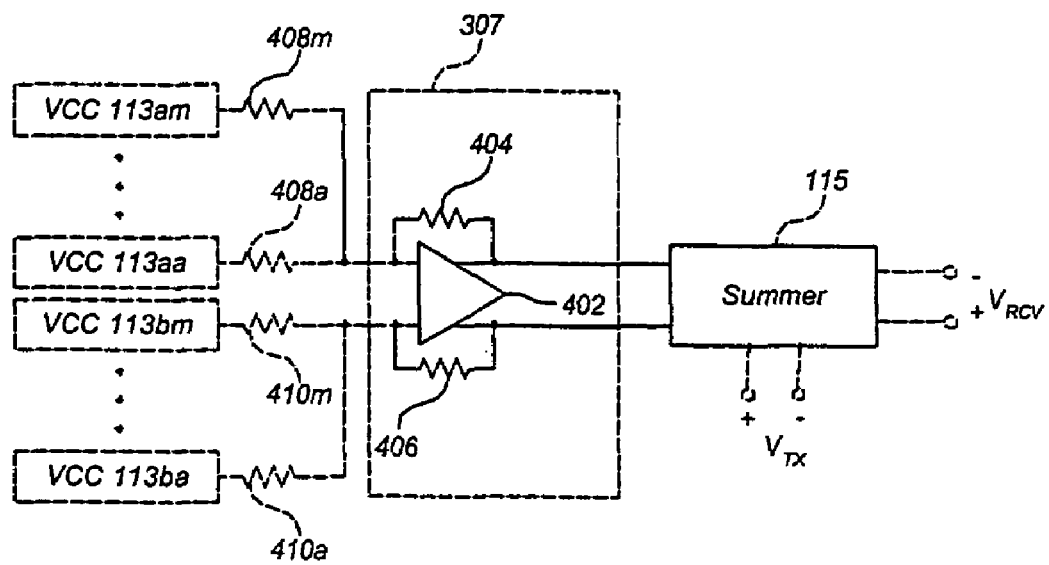

FIG. 28 shows detail of converter according to one implementation.

Figure 29:
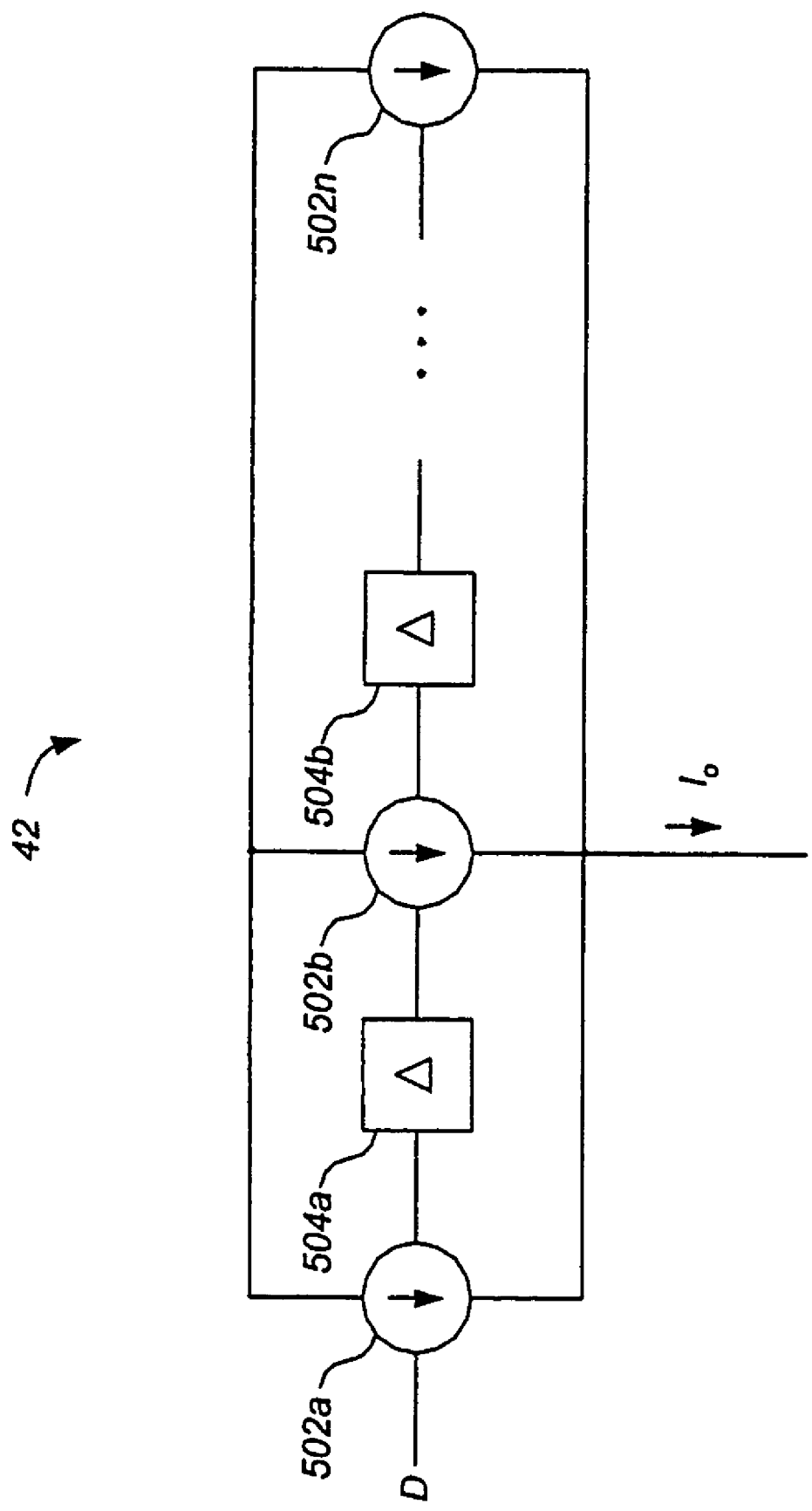

FIG. 29 shows detail of a DAC according to some implementations.

Figure 30:
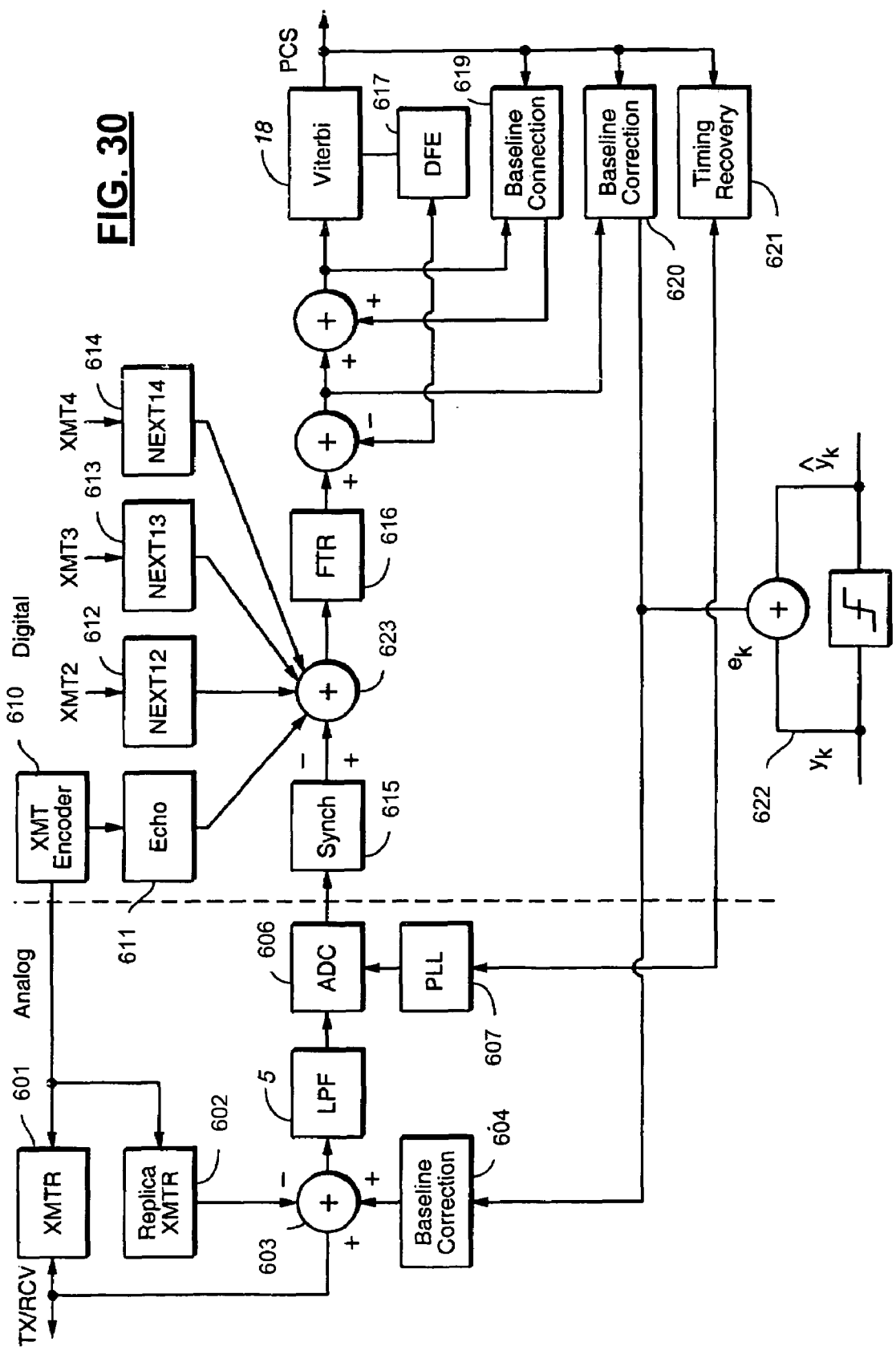
Figure 31:
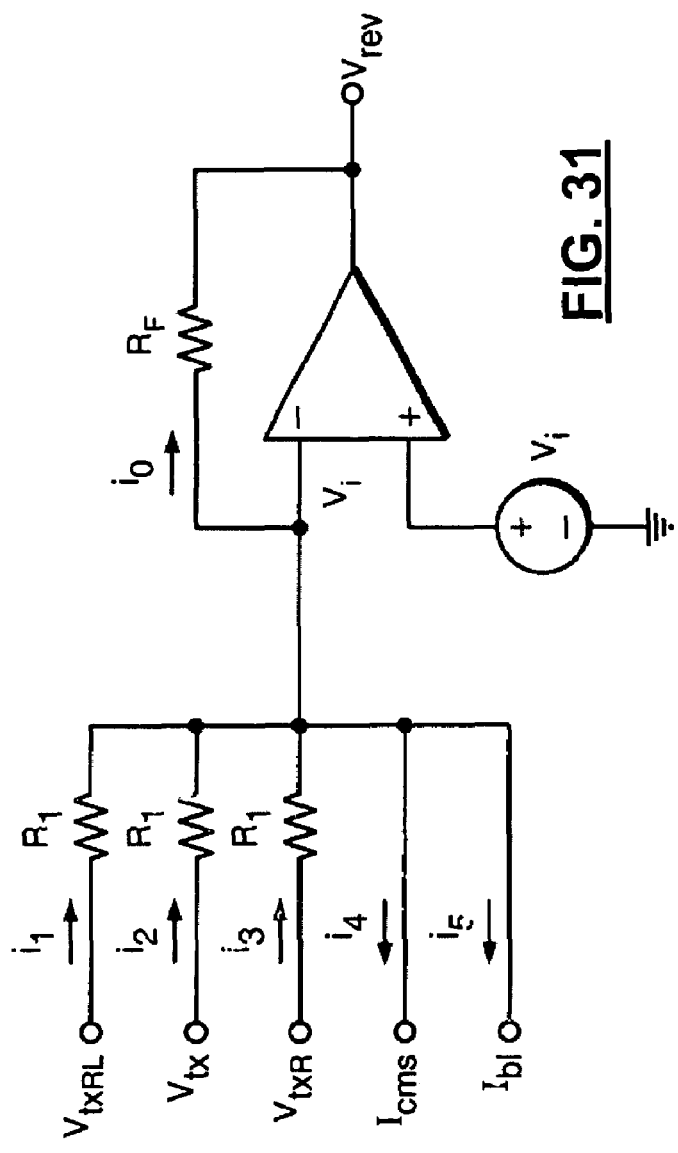
Figure 32:
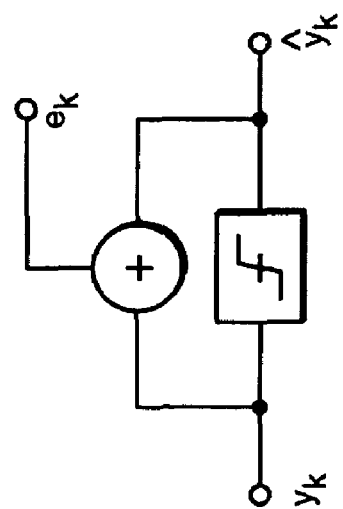

FIG. 30 is a functional block diagram of a transceiver;

FIG. 31 is a circuit diagram illustrating baseline correction to an active summer;

FIG. 32 is a circuit diagram illustrating error correction.

Figure 33:
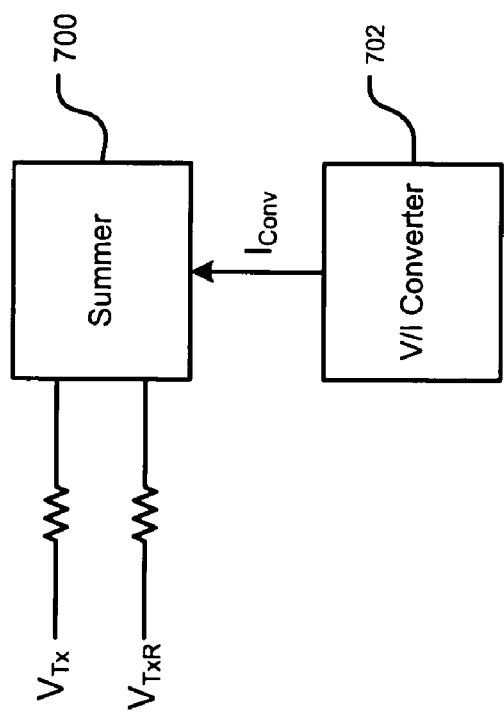

FIG. 33 is a circuit diagram illustrating a summer that receives a transmitter signal, a replica transmitter signal and an output of a voltage to current converter.

Figure 34:
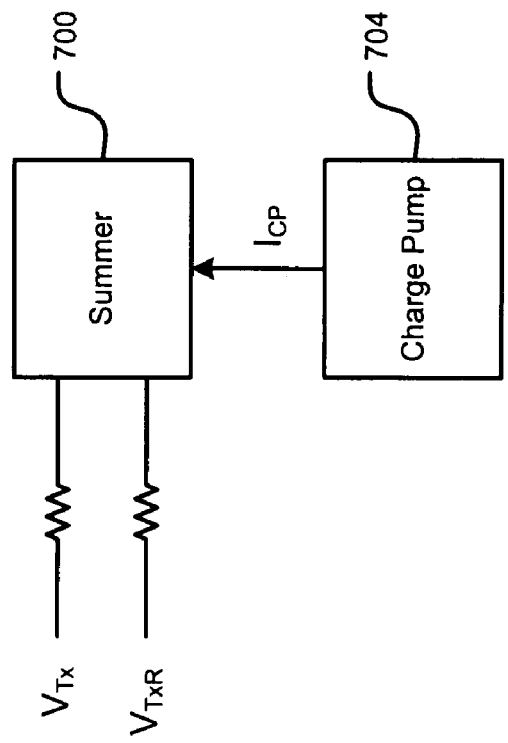

FIG. 34 is a circuit diagram illustrating a summer that receives a transmitter signal, a replica transmitter signal and an output of a charge pump.

DETAILED DESCRIPTION OF THE PREFERRED EMBODIMENTS

The present invention will be described with respect to circuits and methods for shaping waveforms, and in particular, to a digital-to-analog converter (DAC) employing such a waveshaping circuit. However, as will be appreciated by those skilled in the art, the present invention is not limited to applications involving DACs, but also may be applied to other applications, such as signal processing, systems to control signal rise/fall time, signal storage, communications, etc. Moreover, while the present invention is particularly suited to applications in the read channel of a hard disk drive, many other applications will suggest themselves to persons of skill in the electrical engineering arts. Furthermore, the present invention is particularly suitable for use with the structure described in U.S. patent application Ser. No. 09/737,743, entitled "Active Replica Transformer Hybrid," filed concurrently herewith, the contents of which are incorporated herein by reference.

Figure 6:
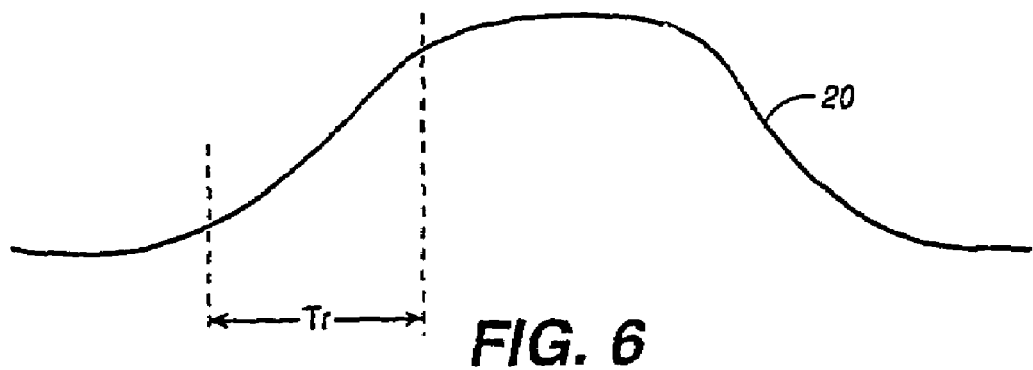
FIG. 6 is a graphical depiction of a waveshape having smooth transition areas.

FIG. 6 illustrates a desired signal output 20. The output waveform 20 includes smooth transition areas, which reduce noise such as electromagnetic interference. A preferred rise time ("$T_r$") for a DAC is 3-5 nanoseconds (ns).

Figure 7:
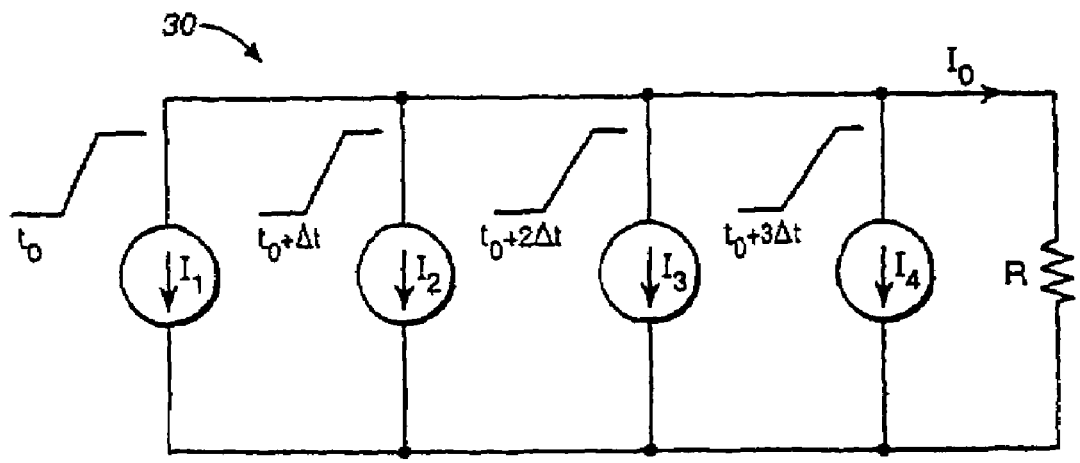
FIG. 7 is a circuit diagram of a current source according to the present invention.
Figure 8:
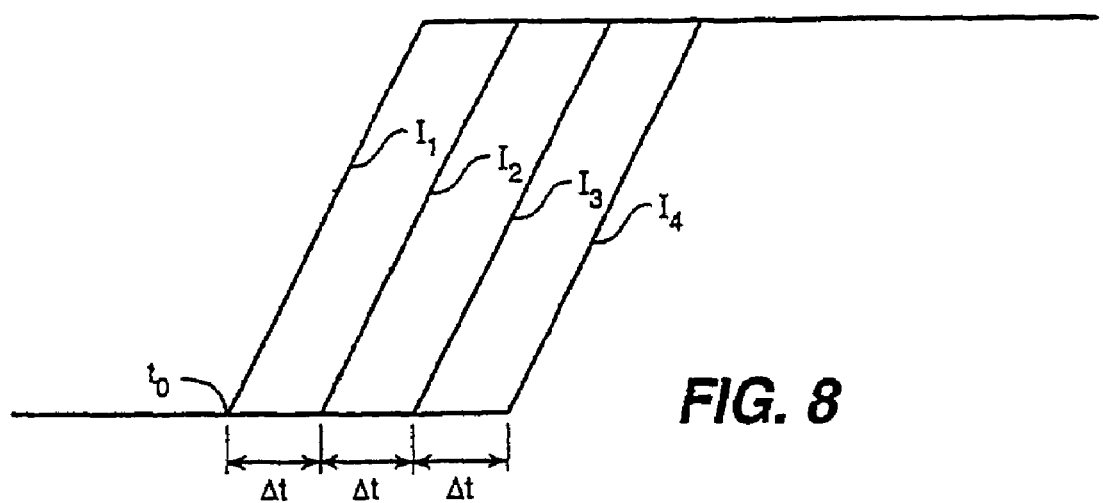
FIG. 8 is a graphical depiction of current components of the current source illustrated in FIG. 6.

The present invention generates a signal to approximate the desired signal output 20 with a current source 30. As shown in FIG. 7, current source 30 includes a plurality of current sources. For example, current source 30 may include current sources $I_1$, $I_2$, $I_3$ and $I_4$. Current sources $I_1$, $I_2$, $I_3$ and $I_4$ each preferably generate a respective current $I_n$, where n is 1, 2, 3 or so forth. The signals $I_n$ are preferably equal in magnitude and form, and may include a signal delay. In the FIG. 7 example, current sources $I_n$ each generate a linear ramp. For example, consider a signal I1, which includes a linearly rising edge starting at time t0. Current I2 mirrors current I1, except that I2 includes a linearly rising edge starting at time t0+Δt. The variable Δt represents an amount of delay time. Current I3 mirrors currents I1 and I2, except that current I3 includes a linearly rising edge starting at time t0+2Δt. Similarly, current I4 mirrors currents I1, I2, and I3, except that its linearly rising edge starts at time t0+3Δt. The relative waveform components for currents $I_1$, $I_2$, $I_3$ and $I_4$ are shown in FIG. 8.

Figure 9:
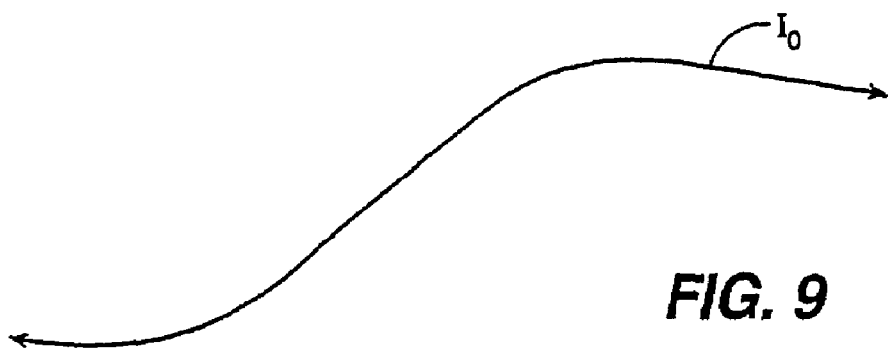
FIG. 9 is a graphical depiction of a resultant output waveshape from the current source illustrated in FIGS. 6 and 7.

Currents $I_1$, $I_2$, $I_3$ and $I_4$ are summed (or mixed) to produce a resultant waveform I0 as shown in FIG. 9. Waveform I0 approximates the desired output signal shown in FIG. 6. Like the desired output signal of FIG. 6, waveform I0 has many desirable properties. For example, I0 has selectable transition areas (corners). The transition areas can be smooth, or sharp, by selectively adjusting the length of Δt. Also, waveform I0 accommodates arbitrary rise/fall times.

Figure 10:
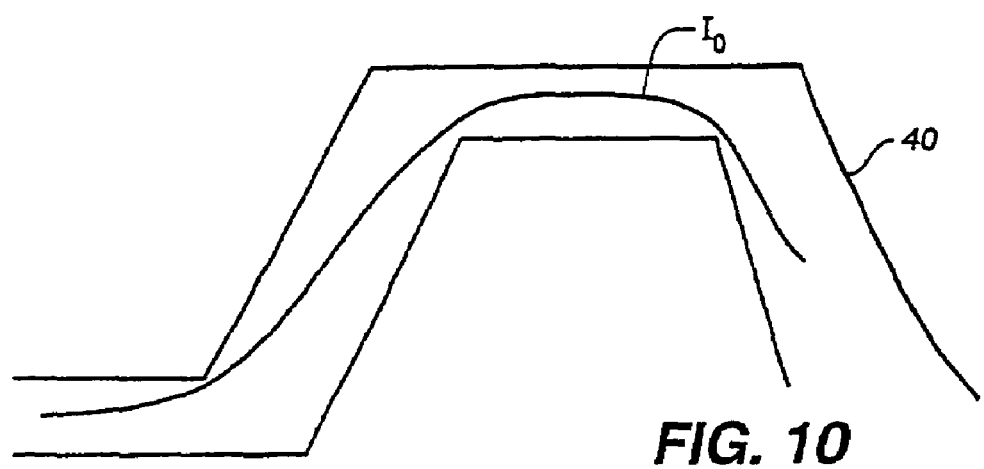
FIG. 10 is a graphical depiction of a waveform template, and a waveshape that fits within the template.

The waveform I0 can also be adjusted by varying Δt to fit within specified requirements. For example, with reference to FIG. 10, waveform I0 can be adjusted to fit within a template 40, for example, as provided by the IEEE standard waveform shape. In this example, I0 has been optimized to produce low electromagnetic interference and to fit within the IEEE template 40.

The delay variable Δt is preferably controlled using a delay-locked loop or is controlled by reference to an external clock. As such, Δt can be precisely regulated. A waveform which is independent of temperature and/or process considerations can then be generated.

The generation of a linear ramp is explained with reference to FIGS. 11-13. A signal is produced from current source 50, which includes a plurality of current sources I1 through In. Each of the plurality of current sources generates a replica signal I. In this example, input signal I is preferably a square waveform. The signal I is delayed by Δt from each subsequent current source, after the initial current source I1. For example, I2 is delayed by Δt, and In is delayed by nΔt. The currents are summed (or mixed) in a known manner to produce an output which approximates a linear ramp.

Figure 12A:
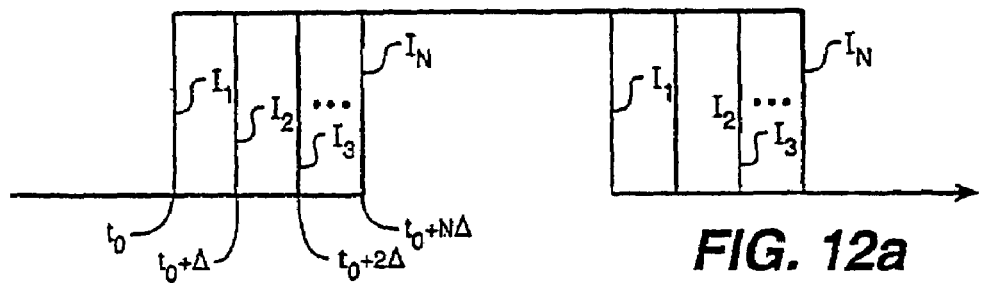
FIGS. 12a-12c are graphical depictions of waveshapes generated by the current source of FIG. 10.
Figure 12B:
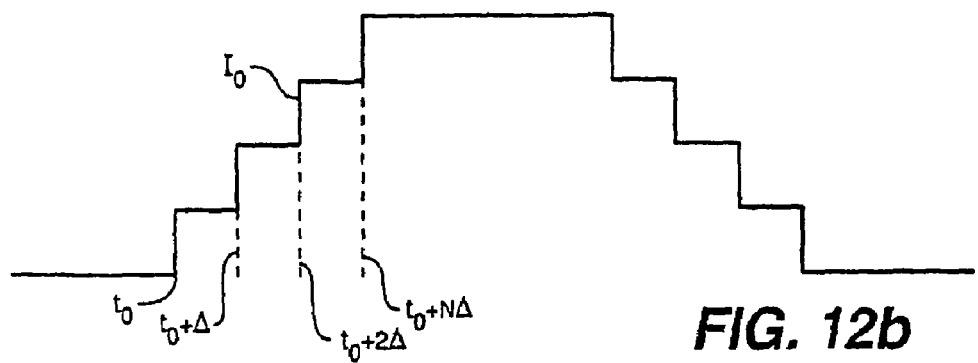
Figure 12C:
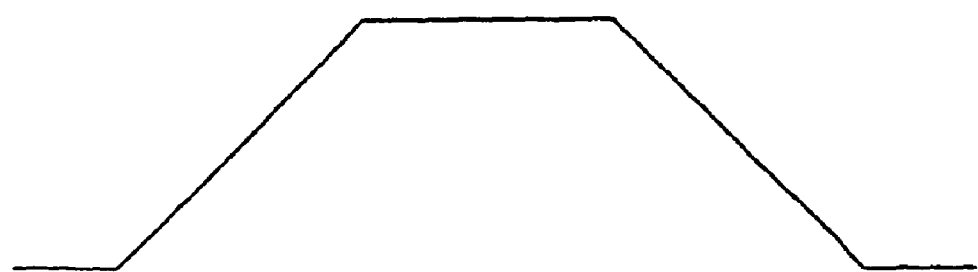

With reference to FIG. 12a, the signal components of the individual current sources are relatively illustrated. FIG. 12b illustrates the resultant waveshape 10, which includes a stair-step pattern. A linear ramp, as shown in FIG. 12c, is approximated as the length of the delay variable Δt is decreased.

Figure 13:
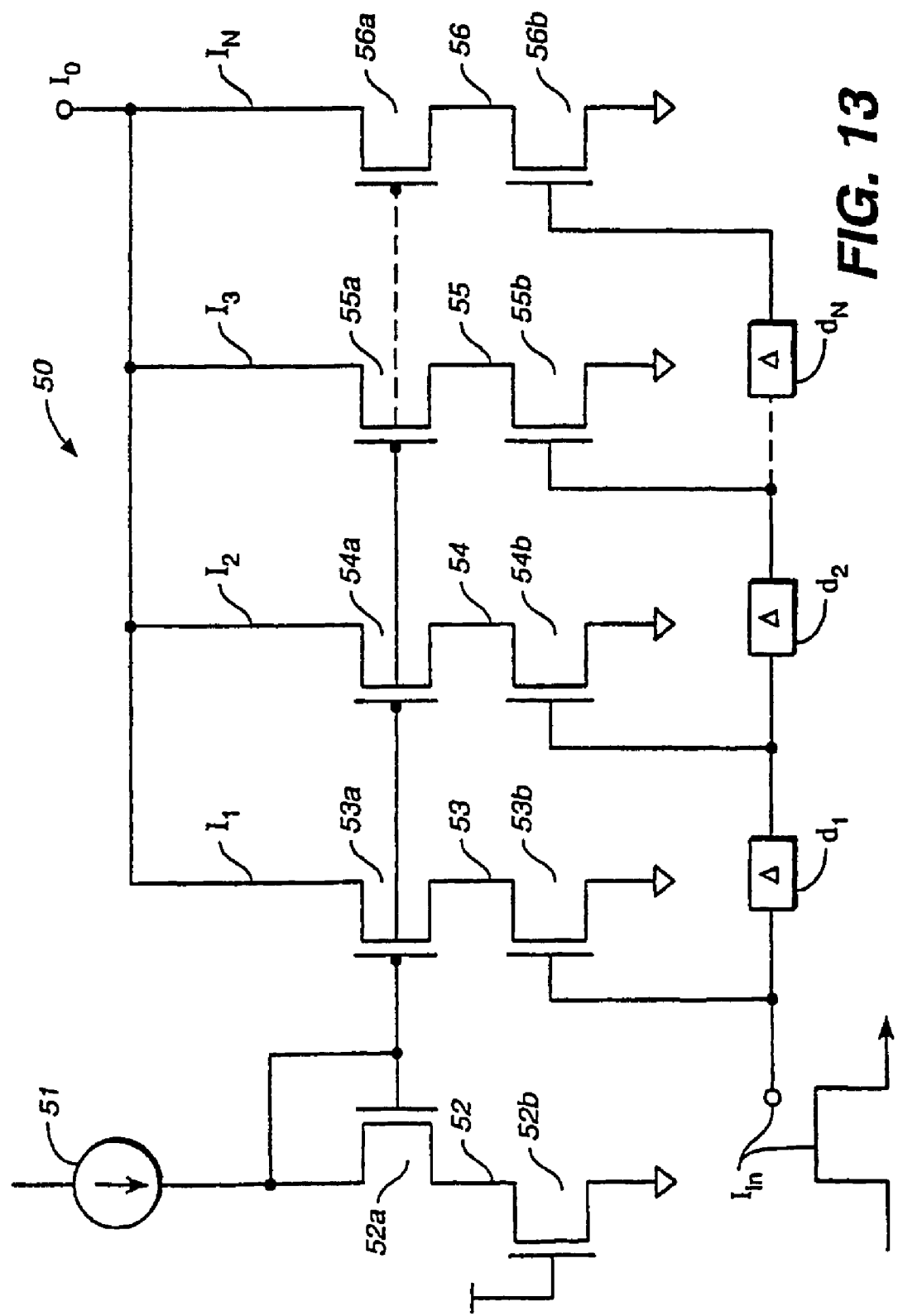
FIG. 13 is a circuit diagram of a current source according to the present invention.

A circuit diagram of the current source 50 is shown in FIG. 13. Current source 50 includes a plurality of transistor pairs 52-56, where pair 56 represents the nth transistor pair. With reference to FIG. 13, a current source 51 drives transistor pair 52. Transistor pair 52 includes a transistor 52a communicating with a transistor 52b. Transistor 52a is preferably configured with gate-to-drain feedback. The gate of transistor 52b is biased so as to operate in an "on" state. The gate/drain of transistor 52a communicates with the gates of transistors 53a, 54a, 55a and 56a. The drains of transistors 53a-56a each communicates with an output Io. The gates of transistors 53b-56b each communicates with an input waveform Iin (e.g., a square signal), some through delay elements. For example, the gate of transistor 54b communicates with waveform Iin through delay element d1. The gate of transistor 55b communicates with waveform Iin through delay element d2 and delay element d1. Similarly, the gate of transistor 56b communicates with waveform Iin through each of the delay elements d1 through dn. In the preferred embodiment, each of delay elements d1-dn delays the signal by Δ. Delay elements can be realized via known delay locked loops.

The operational aspects of FIG. 13 are now even further explained. Initially, waveform Iin is communicated to the gate of transistor 53b, which turns on the transistor pair 53. A signal I1, which is proportional to the waveform Iin, is output at Io. Waveform Iin is also communicated to delay element d1, which delays the waveform by Δ seconds. After Δ seconds, delay element d1 communicates the delayed waveform to the gate of 54b, which turns on the transistor pair 54. A signal I2, which is proportional to Iin, is output at Io. The resultant waveform Io includes the sum (or mixture) of signals I1 and I2. The input waveform Iin is respectively delayed before communicating with the gates of transistors 55b and 56b. Transistor pairs 55 and 56 are activated (e.g., turned on) and respectively supply current I3 and In, which are added to the resultant waveform I. The current source 50, as shown in FIG. 11, is therefore realized.

Figure 1:
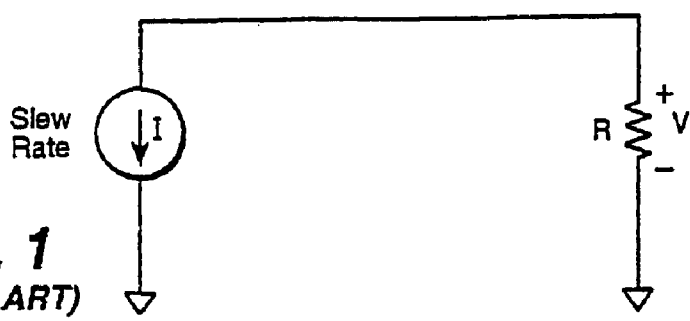
FIG. 1 is a diagram of a conventional circuit, which includes a slew rate controlled current source.
Figure 2:
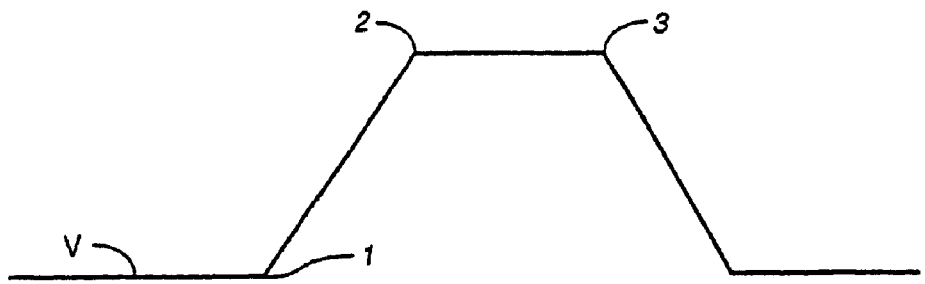
FIG. 2 is a graphical depiction of a waveshape corresponding to an output of the FIG. 1 circuit.
Figure 3:
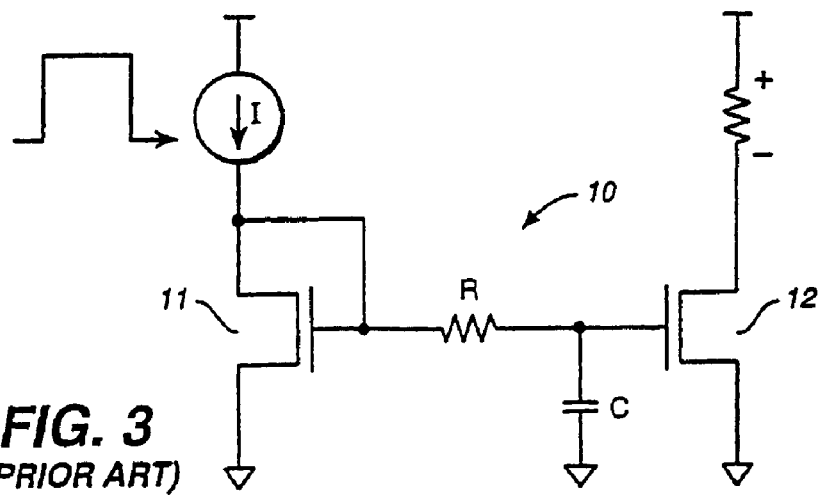
FIG. 3 is a view of a conventional circuit including a current mirror having an RC filter.
Figure 11:
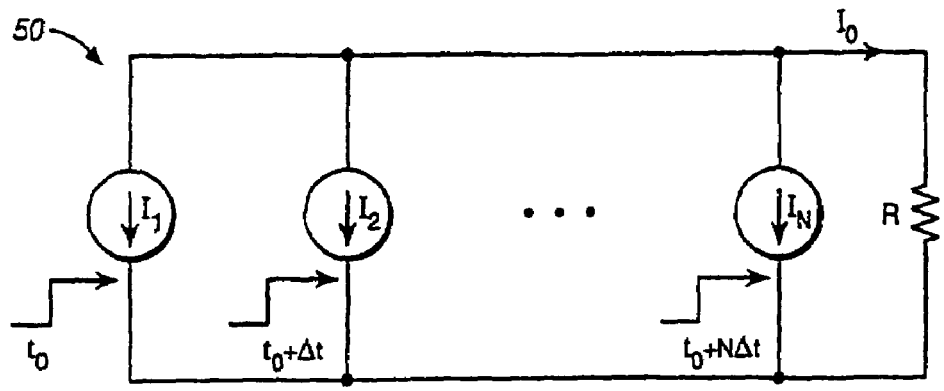
FIG. 11 is a circuit diagram of a current source according to the present invention.

There are many advantages of the configurations shown in FIGS. 11 and 13. For example, individual current sources (e.g., In) can be turned on/off on demand, particularly since Vgs is large and constant. Also, the current source 50 will generally consume less power than the current mirror shown in FIG. 3, particularly since a current mirror typically employs a DC bias. An additional advantage is that with a small Iin, the VGS voltage is also small (e.g., close to the threshold voltage VT). In such a case, VGS−VT−VDS equals a small number of current sources with negative VDS.

Figure 14:
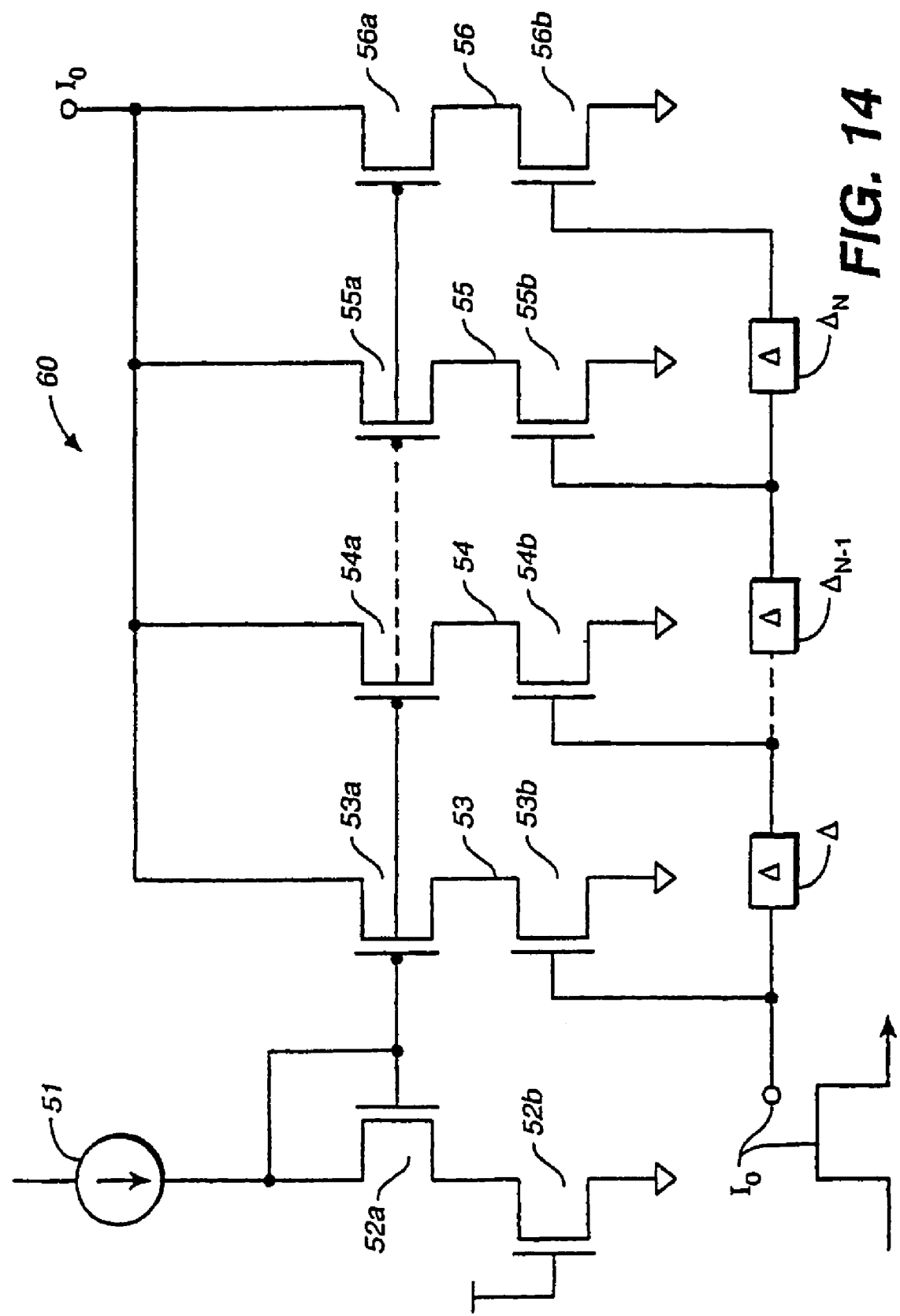
FIG. 14 is a circuit diagram of a current source having variable delay elements according to the present invention.

A further current source 60 is shown in FIG. 14. The current source 60 is configured in the same manner as the current source 50 shown in FIG. 13, except that the delay elements may include variable delays. The same components with respect to FIG. 13 are labeled with their same reference numerals in FIG. 14. In the FIG. 14 embodiment, delay elements Δ are non-uniform throughout the circuit. For example, Δ may involve a longer delay than Δn−1, and so forth. Non-uniform delays may be employed to generate a smooth waveform. Multiple delay-locked-loops are preferably used to achieve different delay times.

To illustrate, an output waveform processed with uniform delay elements is shown in FIG. 15a. Here a stair step waveform is produced, which may approximate a linear ramp, particularly as the variable Δ is decreased in length (e.g., time). In contrast, the amount of delay is varied with respect to individual delay elements as shown in FIG. 15b. The approximated waveshape of FIG. 15b is smooth (e.g., includes smooth transition areas) in comparison to the approximated linear waveshape of FIG. 15b. Eight steps (or corresponding current sources) are employed in a preferred embodiment for a Gigabit channel. Of course, the number of levels may be varied according to need or design without deviating from the scope of the present invention.

Figure 16:
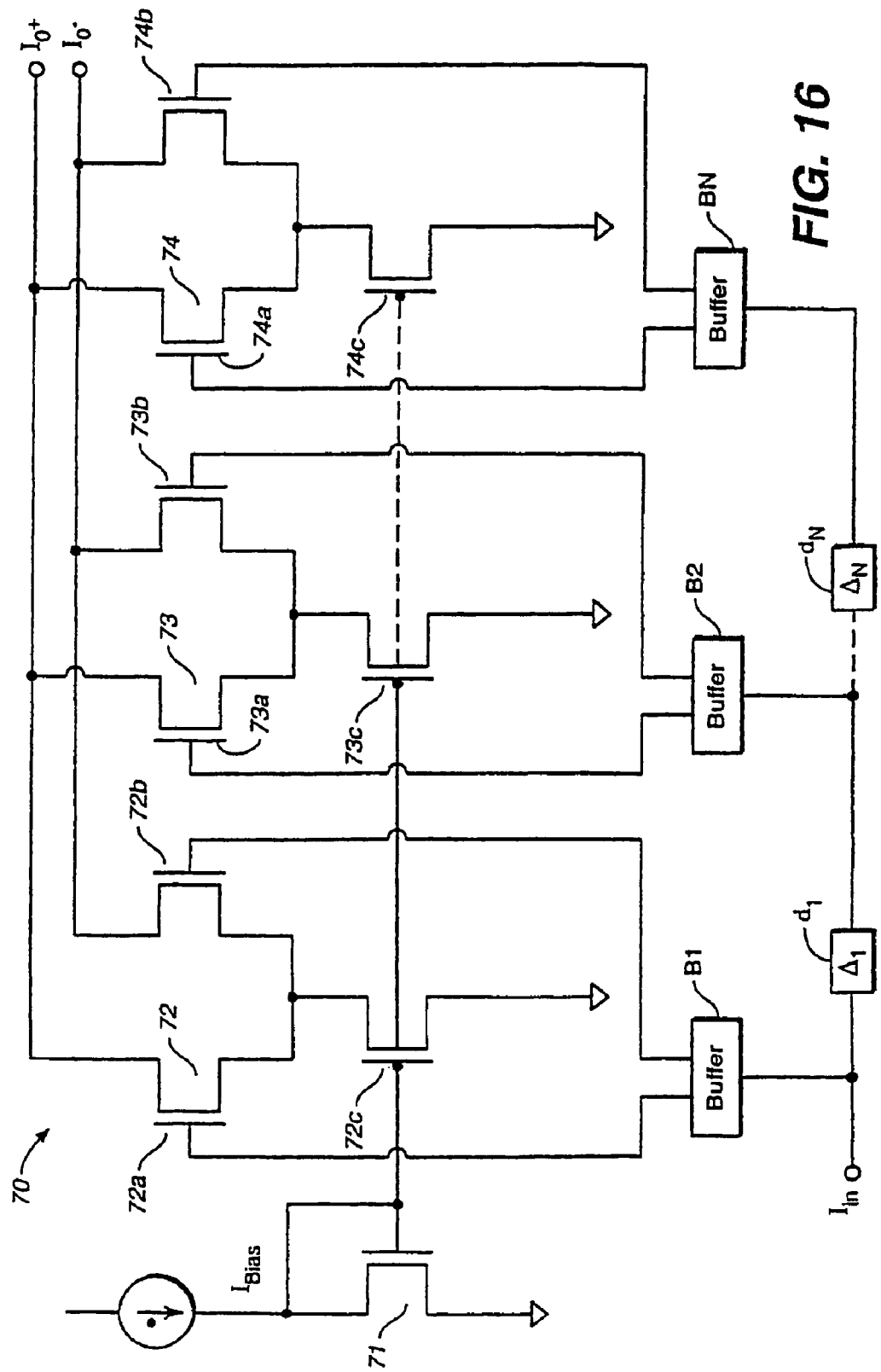
FIG. 16 is a circuit diagram of a current source including a plurality of differential transistor pairs according to the present invention.

A further embodiment of a current source is illustrated in FIG. 16. The illustrated current source 70 includes a plurality of differential transistor pairs 72-74, where 74 represents the nth differential transistor pair. A bias current $I_B$ is supplied to the gate of transistors 72c, 73c and 74c. An input waveform Iin is communicated to the gates of 72a, 72b, 73a, 73b, 74a and 74b. In the case of transistor pair 73 and 74, the input waveform Iin is delayed through delay elements d1 and d1+dn, respectively. Buffers B1-BN are optionally included in the circuit 70 to buffer the input signal Iin. A differential output (Io+, Io−) is accordingly produced.

The advantages of the FIG. 16 current source include constant power dissipation. Also, the circuit provides matching capabilities, for example, for use in an Ethernet channel.

Figure 17:
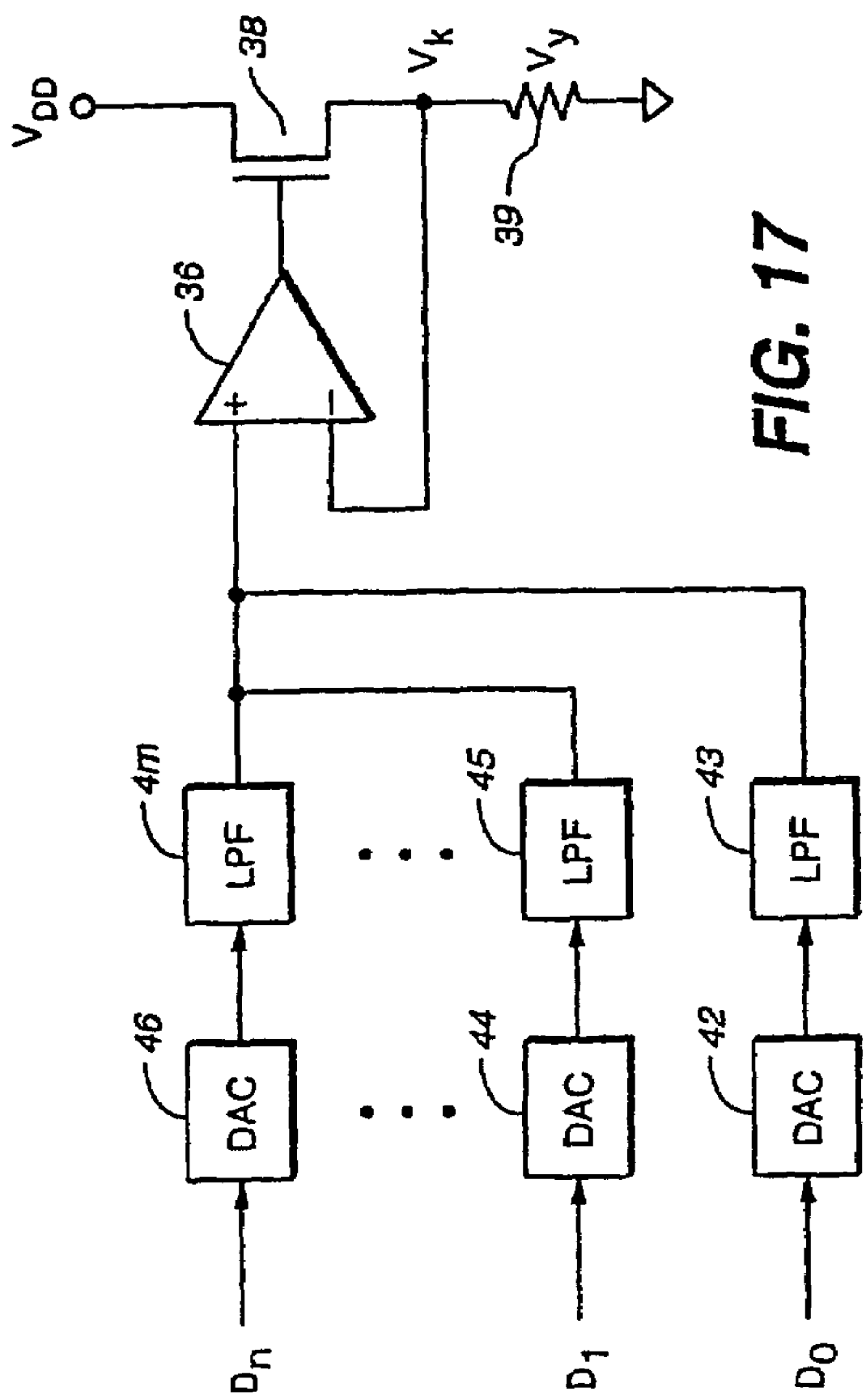
FIG. 17 is a circuit diagram of an alternative embodiment according to the present invention.

One drawback of the differential amplifier in FIG. 16 is that the differential amplifier is a Class A circuit which consumes unnecessary power even when no output is being transmitted. Moreover, a significant number of transistors is required to provide an adequately smoothed output current, thus requiring a large chip area. FIG. 17 depicts a schematic diagram of another embodiment according to the present invention which operates in Class B wherein one DAC is provided for each level of the multilevel input signal. DACs 42, 44, . . . 46 may be provided with corresponding LPFs 43, 45, 4m. Preferably, a circuit according to FIG. 13 supplies each DAC with a control current to provide a stair step output which defines the rise time. In such an embodiment, since each DAC receives control current, and not input current, the transistors which supply each DAC may be smaller than those used in the FIG. 13 embodiment. Additionally, since the control signal determines the rise time of the output of each DAC, the LPFs merely produce a smoother output.

In FIG. 17, multilevel input signal D0, D1, . . . Dn is provided to the parallel DACs 42, 44, . . . 46. The number of DACs may be varied depending on the application. This embodiment solves two problems. First, by providing the FIG. 17 circuit with a staircase waveform, for example, from FIG. 14, an LPF merely smoothes the staircase waveform rather than defines rise time. Second, since the DACs are disposed in parallel, there will be no variations in rise time because each DAC has substantially the same current passing therethrough; that is there will be no bandwidth variation with resultant differences in rise time. The DACs may also be controlled by any appropriate circuitry, such as a decoder disposed prior to the DACs which would, in effect, select which DACs are activated by proper application of the input signals. In an alternative arrangement, a resistor ladder may supply the multilevel signal to the DACs of FIG. 17 rather than the transistors depicted in FIG. 13.

In communication transceivers, and particularly in Ethernet transceivers which are capable of transmitting and receiving data at 1000 megabits bits per second, communication is possible in a full-duplex mode. In other words, transmitting and receiving of data can occur simultaneously on a single communication channel. Implementation of such a full-duplex communication channel results in a composite signal ($V_{TX}$) being present across the output terminals of the transceiver, the composite signal $V_{TX}$ having a differential transmission signal component and a differential receive signal component. In such a communication channel, the received signal ($V_{RCV}$) is derived by simply subtracting the transmitted signal ($V_T$) from the composite signal $V_{TX}$ that is present at the transceiver output terminals. Hence, $V_{RCV} = V_{TX} - V_T$.

This subtraction can be accomplished by generating a signal (referred to as a replica signal) which substantially replicates the transmitted signal, and canceling or subtracting the generated replica signal from the composite signal $V_{TX}$ at the output terminals of the transceiver. However, the replica signal is generated as two single-ended voltages, such as $V_{TXR+}$ and $V_{TXR-}$, whereas the composite signal present at the output terminals of the transceiver is a differential signal. Consequently, in order to cancel the replica signal from the composite signal to thereby obtain the received signal, the two single-ended voltage signals must first be converted to a differential signal that can then be subtracted from the composite signal. This conversion, however, requires additional circuitry which adds to the cost and complexity of the transceiver.

While the present invention will be described with respect to an Ethernet controller for use in general purpose computers, printers, routers, etc. it is to be understood that the present invention may find applicability in other fields such as Internet communications, telecommunications, or any processor-to-processor applications using full-duplex communication.

Communication in an Ethernet computer network is illustrated in FIG. 18. As shown, an Ethernet communication channel 140 comprises a first Ethernet transceiver 142, a second Ethernet transceiver 144, and a two-wire interconnection 146 between the first Ethernet transceiver 142 and the second Ethernet transceiver 144. For example, the two-wire interconnection 146 may comprise a single twisted-pair of a Category 5 cable in accordance with IEEE gigabit transmission standard No. 802.3ab. As the Ethernet transceivers 142 and 144 may be substantially identical, only one of them is described herein.

The Ethernet transceiver 142 has a controlled current source 148, which is used to inject into the Ethernet transceiver 142 a control current $I_{TX}$, which corresponds to a signal to be transmitted from the Ethernet transceiver 142 to the Ethernet transceiver 144. Ethernet transceiver 142 also has a termination resistance 150 and a first coil 152 of a center-tap transformer 154. The center-tap transformer 154 also has a second coil 156 coupled to the two-wire interconnection 146 to provide signals transmitted by the first Ethernet transceiver 142 to the second Ethernet transceiver 144. The center-tap transformer 154 serves to couple AC voltage signals between the Ethernet transceivers 142 and 144 while effectively decoupling the Ethernet transceiver 142 from the Ethernet transceiver 144 with respect to DC voltage signals. A pair of terminals 158, 160 is provided to measure a voltage $V_{TX}$ present across the resistor 150 as a result of both signals transmitted by the Ethernet transceiver 142 and signals received by the Ethernet transceiver 142 from the Ethernet transceiver 144 via the two-wire interconnection 146. The voltage $V_{TX}$ thus comprises a composite differential signal that includes a differential transmission signal component and a differential receive signal component.

As described in more detail below, the differential receive signal component of the composite differential signal $V_{TX}$ is determined in accordance with the present invention by subtracting a replica of the differential transmission signal component from the composite differential signal $V_{TX}$. In the illustrated embodiment, the Ethernet transceiver 142 includes the termination resistance 150, the center-tap transformer 154, and an integrated circuit 162 containing communications circuitry for implementing the functionality of the Ethernet transceiver 142.

An exemplary embodiment of such Ethernet transceiver communications circuitry is illustrated in the schematic of FIG. 19. As shown in FIG. 19, an integrated circuit 170 has a pair of output terminals 172, 174, which are coupled to terminals 76, 78, respectively, of the winding 152 of the center-tap transformer 154. Current in the winding 152 of the center-tap transformer 154 induces a proportional current in the secondary winding (not shown in FIG. 19) of the center-tap transformer 154, and that proportional current is communicated over the two-wire interconnection 146 (FIG. 18) to another Ethernet transceiver coupled thereto. Also coupled between the output terminals 172, 174 is a termination resistance 80, which, in the illustrated embodiment of FIG. 19, comprises a pair of termination resistors 82, 84. Preferably, the termination resistors 82, 84 have resistance values to substantially match the 100 ohm characteristic impedance of Category 5 cable in accordance with established standards for Ethernet connections.

The integrated circuit 170 also includes a transmission signal replicator 86 or other suitable circuitry for generating first and second single-ended replica transmission signals $V_{TXR+}$ and $V_{TXR-}$, which together substantially comprise a replica of the differential transmission component of the composite differential signal $V_{TX}$. In the illustrated embodiment, the transmission signal replicator 86 comprises a pair of metal-oxide semiconductor (MOS) transistors 88, 90.

The transistor 88 is coupled between the output terminal 172 and one end of a resistor 92, the other end of the resistor 92 being coupled to ground. Similarly, the transistor 90 is coupled between the output terminal 174 and one end of a resistor 94, the other end of which is coupled to ground. The gate of each transistor 88, 90 is coupled to and driven by the output of a respective operational amplifier 96, 98. The operational amplifier 96 has a non-inverting input 100 and an inverting input 102. The inverting input 102 of the operational amplifier 96 receives a feedback signal from the junction of the source of the transistor 88 and the resistor 92. Likewise, the operational amplifier 98 has a non-inverting input 104 and an inverting input 106, which receives a feedback signal from the junction of the source of the transistor 90 and the resistor 94.

A differential control voltage signal is applied between the non-inverting input 100 of the operational amplifier 96 and the non-inverting input 104 of the operational amplifier 98. This differential control voltage signal, when subjected to the voltage-to-current conversion brought about by the transmission signal replicator 86, provides the differential transmit signal component at the output terminals 172, 174. The feedback signal to the inverting input 102 of the operational amplifier 96 comprises a first single-ended replica transmit signal $V_{TXR+}$, and the feedback signal to the inverting input 106 of the operational amplifier 98 comprises a second replica transmit signal $V_{TXR-}$.

The single-ended replica transmit signals $V_{TXR+}$ and $V_{TXR-}$ are converted to a differential replica transmit signal by a converter circuit 107, which comprises respective differential operational amplifiers 108, 110, each provided with suitable input and feedback resistors, as shown in FIG. 19. The outputs of the differential operational amplifiers 108 and 110 are coupled to a differential active summer 112, which, in the embodiment of FIG. 19, comprises a differential operational amplifier 114 with feedback resistors 116, 118.

Because the differential operational amplifiers 108 and 110 introduce a delay into the replica transmissions signals $V_{TXR+}$ and $V_{TXR-}$, the composite differential signal $V_{TX}$ is coupled to the differential active summer 112 through a further differential operational amplifier 120 arranged in a unity-gain configuration, with input resistors 122, 124, output resistors 126, 128, and feedback resistors 130, 132. This unity-gain operational amplifier simply provides a delay in the composite differential signal $V_{TX}$ which preferably substantially matches the delay introduced in the replica transmission signals $V_{TXR+}$ and $V_{TXR-}$ by the operational amplifiers 108 and 110. As will be readily appreciated by those of ordinary skill in the art, the various input, output, and feedback resistance values associated with the operational amplifiers 108, 110, and 120 may be selected to ensure that these delays are substantially equal to one another.

An alternative embodiment of a communications circuit in accordance with the present invention is shown in the schematic diagram of FIG. 20. Because the transmission signal replicator 86 and the differential active summer 112 in the embodiment of FIG. 20 are identical to those in the embodiment of FIG. 19, the details of those sub-circuits are omitted from the description of the embodiment of FIG. 20. The embodiment of FIG. 20, however, differs from the embodiment of FIG. 19 in the structure of the sub-circuit provided for converting the single-ended replica transmission signals $V_{TXR+}$ and $V_{TXR-}$ into a differential replica transmission signal $V_{TXR}$.

More particularly, as shown in FIG. 20, a converter circuit 240 is coupled to the transmission signal replicator 86 and to the differential active summer 112 to produce the differential replica transmission signal $V_{TXR}$ from the single-ended replica transmission signals $V_{TXR+}$ and $V_{TXR-}$. Converter circuit 240 includes an operational amplifier 242, input resistors 244, feedback resistors 248, and output resistors 246. Just as in the embodiment of FIG. 19, the embodiment of FIG. 20 includes a unity-gain differential operational amplifier 150, which provides a delay in the differential composite signal $V_{TX}$ to substantially match the delay introduced in the differential replica transmission signal $V_{TXR}$ by the converter circuit 240. As will be appreciated by those of ordinary skill in the art, the differential operational amplifier 150 is preferably provided with input, output, and feedback resistors having resistance values which give the differential operational amplifier 150 a unity-gain value. Accordingly, the differential active summer 112 receives as input the delayed differential composite signal $V_{TX}$ and the delayed differential replica transmission signal $V_{TXR}$ and subtracts the latter signal from the former to produce at an output of the differential active summer 112 a differential receive signal which comprises the composite differential signal minus the differential replica transmission signal and thus corresponds to the signal received by the transceiver 170.

The simplification of the converter circuit 240 in the embodiment of FIG. 20, compared to the converter circuit 107 in the embodiment of FIG. 19, is made possible by the fact that the single-ended replica transmission signals $V_{TXR+}$ and $V_{TXR-}$ produced by the transmission signal replicator 86 in the illustrated embodiment are characterized by the feature that when $V_{TXR+}$ is asserted then $V_{TXR-}$ is zero (or ground), and when $V_{TXR-}$ is asserted then $V_{TXR+}$ is zero (or ground). It is because the single-ended replica transmission signals $V_{TXR+}$ and $V_{TXR-}$ have this characteristic that the two differential operational amplifiers 108 and 110 of the converter circuit 107 in the embodiment of FIG. 19 can be replaced by the single differential operational amplifier 142 in the converter circuit 240 of the embodiment of FIG. 20.

This reduction in components in the converter circuit 240 provides not only substantial simplification of the integrated circuit 170 as a whole, but it also reduces the well-recognized manufacturing problem of component mismatch, such as between the two differential operational amplifiers 108 and 110 of the embodiment of FIG. 19, for example, and improves common-mode rejection, which, in turn, results in overall improved performance of the transceiver 142.

Another exemplary embodiment of Ethernet transceiver communications circuitry is illustrated in the schematic of FIG. 21. Referring to FIG. 21, integrated circuit 170 comprises m differential pairs of voltage-to-current converters (VCC) 113. In the preferred embodiment, each VCC 113 comprises a voltage buffer comprising an operational amplifier 36, a transistor 38, and a resistor 39. The inverting input of each operational amplifier 36 receives a feedback signal from a node 109 at the junction of the source of a transistor 38 and a resistor 39. The non-inverting input of each operational amplifier 36 receives a control signal generated by a control circuit (CC) 111 comprising a DAC 42 and an optional low-pass filter (LPF) 43 in response to a bit of a digital control signal D. An important feature is that DAC 42 determines the slew rate. In the preferred embodiment, LPF 43 can be implemented as a single-pole filter. Each VCC 113 generates a bi-level transmit signal component in response to the analog control signal. In a preferred embodiment for use with Gigabit Ethernet, integrated circuit 170 includes 8 differential pairs of VCCs, and so is capable of producing a 17-level signal.

The transmit signal components generated by VCCs 113aa through 113am are combined to provide a multi-level signal that forms a first polarity of differential transmit signal $V_T$, which appears at terminals 172, 174 as a component of composite signal $V_{TX}$. The transmit signal components generated by VCCs 113ba through 113bm are combined to provide a multi-level signal that forms a second polarity of signal $V_T$. Composite signal $V_{TX}$ is fed to a differential active summer 115, which can be implemented in a manner similar to summer 112 of FIG. 19. Summer 115 also receives replicas of the transmit signal components produced by each VCC 113.

One feature of the arrangement of FIG. 21 is that the transmit signal is free of the distortion shown in FIG. 24. FIG. 25 shows a waveform produced by the circuit of FIG. 21. Because each level of the transmit signal is generated independently by similar circuits, the slew rates are the same for each signal level. Consequently, as shown in FIG. 25, the rise time t for each signal level is the same.

Another feature of the arrangement of FIG. 21 is the provision of an accurate replica of the transmit signal components produced by the VCCs. In particular, referring to FIG. 21, the current that generates a replica of a transmit signal component at a node 109 is the very same current that generates the transmit signal component. Hence, the replica signal produced by a VCC 113 is unaffected by process and temperature variations, and so is a very accurate replica of the transmit signal component generated by that VCC 113. Further, because node 109 is a low-impedance node, the replica signal can be tapped at node 109 with very little disturbance to the transmit signal component.

For example VCC 113am is paired with VCC 113bm. Each VCC 113 in a differential pair provides a replica signal component to a converter 107, which can be implemented as shown in FIG. 19. For example, VCC 113am and VCC 113bm provide replica signal components to converter 107m. Each converter produces a differential replica signal component based on the single-ended signals received from the VCCs 113, and provides the differential replica signal components to summer 115. Summer 115 obtains the received signal $V_{RCV}$ by subtracting the differential replica signal components from the composite signal $V_{TX}$ that is present at the transceiver output terminals.

FIG. 26 shows detail of a converter 107a according to one implementation. The outputs of VCCs 113aa and 113ba are coupled through resistors 308 and 310 to a differential operational amplifier 302 having feedback resistors 304 and 306. The outputs of differential operational amplifier 302 are supplied to summer 115. The remaining converters 107 are similarly implemented and connected to summer 115.

Another exemplary embodiment of Ethernet transceiver communications circuitry is illustrated in the schematic of FIG. 27. The integrated circuit 170 of FIG. 27 differs from that of FIG. 21 in that a single converter 307 replaces the multiple converters 107a through 107m of FIG. 21.

FIG. 28 shows detail of converter 307 according to one implementation. The outputs of VCCs 113aa through 113am are coupled through resistors 408a through 408m to one input of a differential operational amplifier 402 having feedback resistors 404 and 406. The outputs of VCCs 113ba through 113bm are coupled through resistors 410a through 410m to the other input of differential operational amplifier 402. The outputs of differential operational amplifier 402 are supplied to summer 115.

FIG. 22 shows detail of a DAC 42 according to some implementations. Referring to FIG. 22, DAC 42 operates as described above for the current source 50 of FIG. 12. DAC 42 receives a bit D from decoder 166, and provides a control current Io to LPF 43. Current Io is a staircase waveform such as those discussed above with reference to FIGS. 15a and 15b. Because this control signal determines the rise time of the output of each DAC, the LPFs 43 produce a smoother output. This embodiment solves two problems. First, by providing the LPFs with a staircase waveform, the LPFs merely smooth the staircase waveform rather than define rise time. Second, because the DACs 42 are disposed in parallel, there are no variations in rise time because each DAC 42 has substantially the same current passing therethrough; that is, there is no bandwidth variation with resultant differences in rise time. The DACs 42 may also be controlled by any appropriate circuitry, such as a decoder disposed prior to the DACs which would, in effect, select which DACs are activated by proper application of the input signals. In other implementations each DAC 42 provides a single-step waveform to a LPF 43.

Thus each control circuit 111 (formed by a DAC 42 and a LPF 43) provides a ramp waveform to one of the voltage-to-current converters 113, thereby controlling the slew rates of the voltage-to-current converters. Controlling the slew rates in this manner reduces unwanted high-frequency components that would be generated with higher slew rates. Further, because the slew rates are similar for each of the voltage-to-current converters, the bandwidth of the multi-level transmit signal is not dependent on the value of the control signal, resulting in a signal with small and uniform distortion across signal levels.

FIG. 29 shows detail of a DAC 42 according to some implementations. DAC 42 includes a plurality of current sources 502a, 502b through 502n, and a plurality of delay elements 504. Current source 502a receives a bit D from decoder 166, and generates a current in response. Delay unit 504a provides a delayed signal to a current source 502b, which provides a delayed current, and so on. The sum of the currents are provided as current Io.

Another exemplary embodiment of Ethernet transceiver communications circuitry is illustrated in the schematic of FIG. 23. Referring to FIG. 23, integrated circuit 170 comprises m differential pairs of digital-to-analog converters (DAC) 190. Each DAC 190 provides a transmit signal component in response to a bit D of a digital control signal. The transmit signal components provided by DACs 190aa through 190 am are combined to produce a first polarity of differential transmit signal $V_T$, which appears at terminals 172, 174 as a component of composite signal $V_{TX}$. Similarly, the transmit signal components provided by DACs 190ba through 190*bm* are combined to produce a second polarity of differential transmit signal $V_T$. Signal $V_{TX}$ is also fed to summer 117.

Summer 117 also receives a replica of the transmit signal components produced by DACs 190*a* and 190*b*. The replicas are produced by DACs 190*ca* through 190*cm* and DACs 190*da* through 190*dm*. Summer 117 subtracts the replica signal $V_{TXR}$ from the composite signal $V_{TX}$ to obtain the receive signal $V_{RCV}$. In some implementations, each DAC 190 is implemented as shown in FIG. 22.

Figure 4:
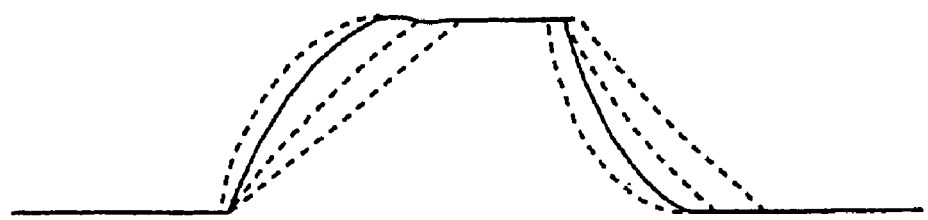
FIG. 4 is a graphical depiction of a waveshape corresponding to an output of the FIG. 3 circuit.

FIG. 30 is a block diagram illustrating principle components for one of the four channels in a preferred gigabit channel configuration for use in an Ethernet network. As illustrated in FIG. 4, a vertical dashed line divides analog and digital processing components. The analog components preferably include a transmitter ("XMTR") 601, replica transmitter ("Replica XMTR") 602, transmit canceller 603, baseline correction module 604, low pass filter ("LPF") 605, analog-to-digital converter ("ADC") 606, and phase-lock loop ("PLL") 607.

Digital processing components preferably include a transmitter encoder 610, echo module 611, NEXT cancellers 612-614 to assist in removing echoes, synchronization module 615, FIR (Finite Impulse Response) equalizer 616 and a DFE (Decision Feedback Equalizer) 617 to equalize a receive signal, and a Viterbi module 618. The digital processing components also include baseline correction modules 619 and 620 to correct residual baseline wander. A timing recovery module 621, an error correction detector 622 (described in further detail below), and summing junction 623 are also shown.

Referring now to FIGS. 31 and 32, a circuit diagram illustrates baseline correction to an active summer; The baseline wander canceller 604 is preferably decision directed to minimize the error defined by the difference between the equalized value and it's sliced value, as discussed below.

FIG. 31 is a circuit diagram illustrating an active summer. Baseline wander current $I_{bl}$ is also "summed" by the active resistive summer, as shown in FIG. 31, to correct baseline wander. Approximately ninety percent (90%) of all system baseline correction can be obtained through the active summer. The remaining baseline residual can be digitally corrected through an equalizer, for example. As will be appreciated, the FIG. 31 topology allows the current sources ($I_{bl}$ and $I_{cms}$) to each have a fixed output voltage, thus, minimizing current deviation due to finite output resistance.

The baseline wander correction module 604 preferably corrects for baseline wander using a decision-directed method, such as a discrete integrator. The decision-directed method can be implemented with a known charge pump, where the pump sign (e.g., +1/−1) is determined digitally using an error between the equalized baseline signal ($y_k$) and a sliced baseline signal ($\hat{y}_k$) as shown in FIG. 32. As will be appreciated by those skilled in the art, the expected error value (e.g., E[e.sub.k]) is ideally driven to zero. The charge pump is preferably pumped up or down based on the error value. For example, a positive error implies that a negative value should be input into the charge pump. For a negative error, a positive value should be input into the charge pump. The charge pump preferably has at least two current settings to regulate I.sub.bl. Of course, a charge pump with many current settings could be used to obtain finer baseline correction control.

Referring now to FIGS. 33 and 34, a summer 700 that receives the transmitter and replica transmitter signals also receives an output of a voltage to current converter 702 and/or an output of a charge pump 704. Additional details can be found in U.S. Pat. No. 6,775,529, which was previously incorporated herein by reference.

The individual components shown in outline or designated by blocks in the attached drawings are all well-known in the arts, and their specific construction and operation are not critical to the operation or best mode for carrying out the invention.

While the present invention has been described with respect to what is presently considered to be the preferred embodiments, it will be understood that the invention is not limited to the disclosed embodiments. To the contrary, the invention covers various modifications and equivalent arrangements included within the spirit and scope of the appended claims. The scope of the claims is to be accorded the broadest interpretation so as to encompass all such modifications and equivalent structures and functions. For example, the input signals for FIGS. 7, 11, 13, 14 and 16 may be varied to produce different output waveforms. Also, the linear ramp produced by the current source of FIGS. 11 and 13, may be even further processed by the current source of FIG. 7, to produce smooth transition areas. Such modifications are within the scope of the present invention. Also, whereas the illustrated transistors are preferably CMOS transistor, n-type or p-type transistors may also be employed with the present invention.

What is claimed is:

1. A communication circuit, comprising:
   a decoder configured to receive input signals and to provide T decoded signals;
   a transmit section, wherein the transmit section comprises:
      T sets of transmit circuits arranged in parallel,
         wherein each of the T sets of transmit circuits is configured to receive a respective one of the T decoded signals,
         wherein each of the T sets of transmit circuits comprises a digital-to-analog converter (DAC) and is configured to provide a transmit output signal,
         wherein each DAC comprises:
            N current sources arranged in parallel and in a differential configuration,
               wherein each of the N current sources includes a respective control input, and
               wherein the transmit output signal provided by the DAC comprises a sum of outputs of the N current sources; and
            M delay elements,
               wherein an input of a first one of the M delay elements and the control input of a first one of the N current sources are configured to receive the respective one of the T decoded signals,
               wherein an mth one of the M delay elements includes an input in communication with an output of an m−1th one of the M delay elements,
               wherein the output of one of the M delay elements controls a corresponding control input of one of the N current sources,
         wherein a sum of the transmit output signals from the T sets of transmit circuits forms an accumulated output signal,
         wherein each of the T sets of transmit circuits comprises a replica circuit and is configured to provide a replica output signal,
            wherein each replica circuit comprises:

N replica current sources arranged in parallel and in a differential configuration,
wherein each of the N replica current sources includes a respective control input,
wherein the control input of a first one of the N replica current sources is configured to receive the respective one of the T decoded signals,
wherein the output of the one of the M delay elements controls a corresponding control input of one of the N replica current sources,
wherein the replica output signal comprises a sum of outputs of the N replica current sources, and
wherein a sum of the replica output signals from the T sets of transmit circuits forms an accumulated replica output signal; and
a receive section,
wherein the receive section comprises:
an active summer that communicates with a voltage to current converter,
wherein the receive section is configured to receive a composite signal, the accumulated replica output signal and an output of the voltage to current converter, and
wherein the active summer is configured to sum the composite signal, the accumulated replica output signal and the output of the voltage to current converter.

2. The communication circuit of claim 1 wherein the voltage to current converter includes a charge pump.

3. The communication circuit of claim 2, wherein N is equal to 10.

4. The communication circuit of claim 1, wherein T is equal to 16.

5. A communication system, comprising:
means for decoding input signals to provide T decoded signals;
means for transmitting signals, wherein the signal transmitting means comprises:
T sets of means for generating a signal arranged in parallel,
wherein each of the T sets of signal generating means is configured to receive a respective one of the T decoded signals,
wherein each of the T sets of signal generating means comprises a means for converting digital signals to analog signals and is configured to provide a transmit output signal,
wherein each signal converting means comprises:
N means for generating current arranged in parallel and in a differential configuration,
wherein each of the N current generating means includes a respective control input, and
wherein the transmit output signal provided by the signal converting means comprises a sum of outputs of the N current generating means; and
M means for delaying signals,
wherein an input of a first one of the M signal delaying means and the control input of a first one of the N current generating means are configured to receive the respective one of the T decoded signals,
wherein an mth one of the M signal delaying means includes an input in communication with an output of an m−1th one of the M signal delaying means,
wherein the output of one of the M signal delaying means controls a corresponding control input of one of the N current generating means,
wherein a sum of the transmit output signals from the T sets of signal generating means forms an accumulated output signal,
wherein each of the T sets of signal generating means comprises a means for generating a replica output signal,
wherein each replica output signal generating means comprises:
N means for generating a replica current arranged in parallel and in a differential configuration,
wherein each of the N replica current generating means includes a respective control input,
wherein the control input of a first one of the N replica current generating means is configured to receive the respective one of the T decoded signals, and
wherein the output of the one of the M signal delaying means controls a corresponding control input of one of the N replica current generating means,
wherein the replica output signal comprises a sum of outputs of the N replica current generating means, and
wherein a sum of the replica output signals from the T sets of signal generating means forms an accumulated replica output signal; and
means for receiving signals,
wherein the signal receiving means comprises:
an active means for summing that communicates with a voltage to current converting means for converting,
wherein the signal receiving means is configured to receive a composite signal, the accumulated replica output signal, and an output of the voltage to current converting means, and
wherein the active summing means is configured to sum the composite signal, the accumulated replica output signal and the output of the voltage to current converting means.

6. The communication circuit of claim 5 wherein the voltage to current converter means includes charge pump means for generating an output current.

7. The communication system of claim 5, wherein T is equal to 16.

8. The communication system of claim 7, wherein N is equal to 10.

9. A method of communicating signals, comprising the steps of:
a.) decoding T input signals to provide T decoded signals;
b.) transmitting signals, wherein step (b) comprises the steps of:
b1.) differentially providing T transmit output signals in accordance with the T decoded signals,
wherein for each transmit output signal, step (b1) comprises the steps of:
1.) supplying N sources of current;
2.) controlling the supply of current from each of the N sources of current;
3.) delaying current from M of the N sources of current, wherein an input of a first one of the M delaying steps and a control input of a first one of the N sources of current receive a respective one of the T decoded signals, wherein an input of the mth one of the M delaying steps receives a signal from an m−1th one of the M delaying steps, and wherein an output of one of the M delaying steps controls a corresponding one of the N sources of current; and 4.) summing the delayed currents;

b2.) differentially providing T replica output signals in accordance with the T decoded signals, wherein for each replica output signal, step (b2) comprises the steps of:

1.) supplying N sources of replica current;
2.) controlling the supply of current from each of the N sources of replica current, wherein a control input of a first one of the N sources of replica current receives the respective one of the T decoded signals, wherein the output of the one of the M delaying steps controls a corresponding one of the N sources of replica current, and 3.) summing outputs of the N sources of replica current;

b3.) summing the T transmit output signals to generate an accumulated output signal;

b4.) summing the T replica output signals to generate an accumulated replica output signal; and c.) receiving signals, wherein step (c) comprises the steps of:

c1.) receiving a composite signal, the accumulated replica output signal, and an output of a voltage to current converter; and c2.) actively summing the composite signal, the accumulated replica output signal and the output of the voltage to current converter.

10. The method of claim 9 wherein the voltage to current converter includes a charge pump.

11. The method of claim 9, wherein T is equal to 16.

12. The method of claim 11, wherein N is equal to 10.

\* \* \* \* \*

UNITED STATES PATENT AND TRADEMARK OFFICE
CERTIFICATE OF CORRECTION

| | | |
|---|---|---|
| PATENT NO. | : 7,312,739 B1 | Page 1 of 1 |
| APPLICATION NO. | : 11/432886 | |
| DATED | : December 25, 2007 | |
| INVENTOR(S) | : Sehat Sutardja et al. | |

It is certified that error appears in the above-identified patent and that said Letters Patent is hereby corrected as shown below:

| | |
|---|---|
| On the Title Page | Under "Related U.S. Application Data" after "No. 10/972,143," insert -- , filed on October 25, 2004, -- |
| Page 4, Item 56, Line 46 | Under "Dolle" reference, delete "termiantion" and insert -- Termination -- |
| Page 5, Item 56, Line 64 | Under "Jorgensen" reference, delete "10-big" and insert -- 10-bit -- |
| Page 5, Item 56, Line 16 | Under "Koullias" reference, insert -- A900 -- after "TP 9.2:" |
| Page 6, Item 56, Line 1 | Delete "Jounral" and insert -- Journal -- |
| Page 6, Item 56, Line 18 | Under "Narayanan" reference, delete "Propogation" and insert -- Propagation -- |
| Page 6, Item 56, Line 21 | Under "Niknejad" reference, delete "Optimation" and insert -- Optimization -- |
| Page 6, Item 56, Line 50 | Delete "Autoritative" and insert -- Authoritative -- |
| Column 7, Line 45 | Delete "bits" after "megabits" |
| Column 10, Line 47 | Delete "$V_{TXR}+$" and insert -- $V_{TXR+}$ -- |
| Column 13, Line 33 | Delete ";" and insert -- . -- after "summer" |
| Column 13, Line 36 | Delete "it's" and insert -- its -- |

Signed and Sealed this

Twenty-fourth Day of March, 2009

JOHN DOLL
*Acting Director of the United States Patent and Trademark Office*